(12) United States Patent
Sampsell

(10) Patent No.: US 7,527,995 B2
(45) Date of Patent: May 5, 2009

(54) METHOD OF MAKING PRESTRUCTURE FOR MEMS SYSTEMS

(75) Inventor: Jeffrey B. Sampsell, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 287 days.

(21) Appl. No.: 11/134,490

(22) Filed: May 20, 2005

(65) Prior Publication Data
US 2006/0079048 A1    Apr. 13, 2006

Related U.S. Application Data

(60) Provisional application No. 60/613,411, filed on Sep. 27, 2004.

(51) Int. Cl.
*H01L 21/00* (2006.01)
(52) U.S. Cl. .................. 438/48; 438/142; 438/200; 257/E21.009
(58) Field of Classification Search .............. 438/48, 438/142, 200; 257/E21.009
See application file for complete search history.

(56) References Cited

U.S. PATENT DOCUMENTS

| | | |
|---|---|---|
| 2,534,846 A | 12/1950 | Ambrose et al. |
| 3,439,973 A | 4/1969 | Paul et al. |
| 3,443,854 A | 5/1969 | Weiss |
| 3,653,741 A | 4/1972 | Marks |
| 3,656,836 A | 4/1972 | de Cremoux et al. |
| 3,725,868 A | 4/1973 | Malmer, Jr. et al. |
| 3,728,030 A | 4/1973 | Hawes |
| 3,813,265 A | 5/1974 | Marks |
| 3,955,190 A | 5/1976 | Teraishi |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |

(Continued)

FOREIGN PATENT DOCUMENTS

DE    4108966 A1    8/1992

(Continued)

OTHER PUBLICATIONS

Fan et al., "Channel Drop Filters in Photonic Crystals," Optics Express, vol. 3, No. 1, 1998.

(Continued)

*Primary Examiner*—Walter L Lindsay, Jr.
*Assistant Examiner*—Abdulfattah Mustapha
(74) *Attorney, Agent, or Firm*—Knobbe Martens Olson & Bear LLP

(57) ABSTRACT

A method of making an interferometric modulator element includes forming at least two posts, such as posts formed from spin-on glass, on a substrate. In alternate embodiments, the posts may be formed after certain layers of the modulator element have been deposited on the substrate. An interferometric modulator element includes at least two spin-on glass support posts located on the substrate. In alternate embodiments, the support posts may be located over certain layers of the modulator element, rather than on the substrate. A method of making an interferometric modulator element includes forming a rigid cap over a support post. An interferometric modulator element includes support posts having rigid cap members.

18 Claims, 29 Drawing Sheets

U.S. PATENT DOCUMENTS

| | | |
|---|---|---|
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,666,254 A | 5/1987 | Itoh et al. |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,857,978 A | 8/1989 | Goldburt et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,091,983 A | 2/1992 | Lukosz |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,315,370 A | 5/1994 | Bulow |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | Van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,614,937 A | 3/1997 | Nelson |
| 5,619,059 A | 4/1997 | Li et al. |

| Patent | Date | Inventor |
|---|---|---|
| 5,619,365 A | 4/1997 | Rhoades et al. |
| 5,619,366 A | 4/1997 | Rhoades et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,729 A | 7/1997 | Koskinen et al. |
| 5,646,768 A | 7/1997 | Kaeiyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,661,591 A | 8/1997 | Lin et al. |
| 5,661,592 A | 8/1997 | Bornstein et al. |
| 5,665,997 A | 9/1997 | Weaver et al. |
| 5,673,139 A | 9/1997 | Johnson |
| 5,683,591 A | 11/1997 | Offenberg |
| 5,703,710 A | 12/1997 | Brinkman et al. |
| 5,710,656 A | 1/1998 | Goosen |
| 5,726,480 A | 3/1998 | Pister |
| 5,739,945 A | 4/1998 | Tayebati |
| 5,740,150 A | 4/1998 | Uchimaru et al. |
| 5,745,193 A | 4/1998 | Urbanus et al. |
| 5,745,281 A | 4/1998 | Yi et al. |
| 5,751,469 A | 5/1998 | Arney et al. |
| 5,771,116 A | 6/1998 | Miller et al. |
| 5,784,190 A | 7/1998 | Worley |
| 5,784,212 A | 7/1998 | Hornbeck |
| 5,786,927 A | 7/1998 | Greywall et al. |
| 5,793,504 A | 8/1998 | Stoll |
| 5,808,780 A | 9/1998 | McDonald |
| 5,808,781 A | 9/1998 | Arney et al. |
| 5,818,095 A | 10/1998 | Sampsell |
| 5,825,528 A | 10/1998 | Goosen |
| 5,835,255 A | 11/1998 | Miles |
| 5,838,484 A | 11/1998 | Goossen et al. |
| 5,842,088 A | 11/1998 | Thompson |
| 5,867,302 A | 2/1999 | Fleming |
| 5,905,482 A | 5/1999 | Hughes et al. |
| 5,912,758 A | 6/1999 | Knipe et al. |
| 5,943,158 A | 8/1999 | Ford et al. |
| 5,959,763 A | 9/1999 | Bozler et al. |
| 5,986,796 A | 11/1999 | Miles |
| 5,994,174 A | 11/1999 | Carey et al. |
| 6,028,689 A * | 2/2000 | Michalicek et al. ......... 359/224 |
| 6,028,690 A | 2/2000 | Carter et al. |
| 6,038,056 A | 3/2000 | Florence et al. |
| 6,040,937 A | 3/2000 | Miles |
| 6,046,840 A | 4/2000 | Huibers |
| 6,049,317 A | 4/2000 | Thompson et al. |
| 6,049,702 A * | 4/2000 | Tham et al. ................... 455/78 |
| 6,051,858 A * | 4/2000 | Uchida et al. ............... 257/295 |
| 6,055,090 A | 4/2000 | Miles |
| 6,056,406 A | 5/2000 | Park et al. |
| 6,061,075 A | 5/2000 | Nelson et al. |
| 6,097,145 A | 8/2000 | Kastalsky et al. |
| 6,099,132 A | 8/2000 | Kaeriyama |
| 6,100,872 A | 8/2000 | Aratani et al. |
| 6,113,239 A | 9/2000 | Sampsell et al. |
| 6,147,790 A | 11/2000 | Meier et al. |
| 6,158,156 A | 12/2000 | Patrick |
| 6,160,833 A | 12/2000 | Floyd et al. |
| 6,171,945 B1 | 1/2001 | Mandal et al. |
| 6,172,797 B1 | 1/2001 | Huibers |
| 6,180,428 B1 | 1/2001 | Peeters et al. |
| 6,195,196 B1 | 2/2001 | Kimura et al. |
| 6,201,633 B1 | 3/2001 | Peeters et al. |
| 6,215,221 B1 | 4/2001 | Cabuz et al. |
| 6,232,936 B1 | 5/2001 | Gove et al. |
| 6,239,777 B1 | 5/2001 | Sugahara et al. |
| 6,243,149 B1 | 6/2001 | Swanson et al. |
| 6,282,010 B1 | 8/2001 | Sulzbach et al. |
| 6,288,472 B1 | 9/2001 | Cabuz et al. |
| 6,288,824 B1 | 9/2001 | Kastalsky |
| 6,295,154 B1 | 9/2001 | Laor et al. |
| 6,323,982 B1 | 11/2001 | Hornbeck |
| 6,327,071 B1 | 12/2001 | Kimura |
| 6,331,909 B1 | 12/2001 | Dunfield |
| 6,335,831 B2 | 1/2002 | Kowarz et al. |
| 6,356,254 B1 | 3/2002 | Kimura |
| 6,356,378 B1 | 3/2002 | Huibers |
| 6,358,021 B1 | 3/2002 | Cabuz |
| 6,376,787 B1 | 4/2002 | Martin et al. |
| 6,384,952 B1 | 5/2002 | Clark et al. |
| 6,407,851 B1 | 6/2002 | Islam et al. |
| 6,417,868 B1 | 7/2002 | Bock et al. |
| 6,433,917 B1 | 8/2002 | Mei et al. |
| 6,438,282 B1 | 8/2002 | Takeda et al. |
| 6,447,126 B1 | 9/2002 | Hornbeck |
| 6,449,084 B1 | 9/2002 | Guo |
| 6,452,712 B2 | 9/2002 | Atobe et al. |
| 6,456,420 B1 | 9/2002 | Goodwin-Johansson |
| 6,456,190 B1 | 10/2002 | Envoy |
| 6,465,355 B1 | 10/2002 | Horsley |
| 6,466,190 B1 | 10/2002 | Evoy |
| 6,466,354 B1 | 10/2002 | Gudeman |
| 6,466,358 B2 | 10/2002 | Tew |
| 6,473,072 B1 | 10/2002 | Comiskey et al. |
| 6,473,274 B1 | 10/2002 | Maimone et al. |
| 6,480,177 B2 | 11/2002 | Doherty et al. |
| 6,496,122 B2 | 12/2002 | Sampsell |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,589,625 B1 | 7/2003 | Kothari et al. |
| 6,597,490 B2 | 7/2003 | Tayebati |
| 6,600,201 B2 | 7/2003 | Hartwell et al. |
| 6,606,175 B1 | 8/2003 | Sampsell et al. |
| 6,608,268 B1 | 8/2003 | Goldsmith |
| 6,624,944 B1 | 9/2003 | Wallace et al. |
| 6,625,047 B2 | 9/2003 | Coleman, Jr., deceased |
| 6,630,786 B2 | 10/2003 | Cummings et al. |
| 6,632,698 B2 | 10/2003 | Ives |
| 6,635,919 B1 | 10/2003 | Melendez et al. |
| 6,643,069 B2 | 11/2003 | Dewald |
| 6,650,455 B2 | 11/2003 | Miles |
| 6,657,832 B2 | 12/2003 | Williams et al. |
| 6,660,656 B2 | 12/2003 | Cheung et al. |
| 6,661,561 B2 | 12/2003 | Fitzpatrick et al. |
| 6,666,561 B1 | 12/2003 | Blakley |
| 6,674,090 B1 | 1/2004 | Chua et al. |
| 6,674,562 B1 | 1/2004 | Miles et al. |
| 6,674,563 B2 | 1/2004 | Chui et al. |
| 6,680,792 B2 | 1/2004 | Miles |
| 6,698,295 B1 | 3/2004 | Sherrer |
| 6,710,908 B2 | 3/2004 | Miles et al. |
| 6,741,377 B2 | 5/2004 | Miles |
| 6,741,383 B2 | 5/2004 | Huibers et al. |
| 6,741,384 B1 | 5/2004 | Martin et al. |
| 6,741,503 B1 | 5/2004 | Farris et al. |
| 6,747,785 B2 | 6/2004 | Chen et al. |
| 6,747,800 B1 | 6/2004 | Lin |
| 6,775,174 B2 | 8/2004 | Huffman et al. |
| 6,778,155 B2 | 8/2004 | Doherty et al. |
| 6,794,119 B2 | 9/2004 | Miles |
| 6,809,788 B2 | 10/2004 | Yamada et al. |
| 6,811,267 B1 | 11/2004 | Allen et al. |
| 6,819,469 B1 | 11/2004 | Koba |
| 6,822,628 B2 | 11/2004 | Dunphy et al. |
| 6,829,132 B2 | 12/2004 | Martin et al. |
| 6,841,081 B2 * | 1/2005 | Chang et al. .................. 216/24 |

| | | |
|---|---|---|
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,891,658 B2 | 5/2005 | Whitehead et al. |
| 6,912,022 B2 | 6/2005 | Lin et al. |
| 6,947,200 B2 | 9/2005 | Huibers |
| 6,952,303 B2 | 10/2005 | Lin et al. |
| 6,958,847 B2 | 10/2005 | Lin |
| 6,959,990 B2 | 11/2005 | Penn |
| 6,980,350 B2 | 12/2005 | Hung et al. |
| 7,008,812 B1 | 3/2006 | Carley |
| 7,053,737 B2 | 5/2006 | Schwartz et al. |
| 7,075,700 B2 | 7/2006 | Muenter |
| 7,123,216 B1 | 10/2006 | Miles |
| 7,236,284 B2 | 6/2007 | Miles |
| 7,372,619 B2 | 5/2008 | Miles |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0014579 A1 | 2/2002 | Dunfield |
| 2002/0015215 A1 | 2/2002 | Miles |
| 2002/0021485 A1 | 2/2002 | Pilossof |
| 2002/0024711 A1 | 2/2002 | Miles |
| 2002/0027636 A1 | 3/2002 | Yamada |
| 2002/0054424 A1 | 5/2002 | Miles |
| 2002/0070931 A1 | 6/2002 | Ishikawa |
| 2002/0075555 A1 | 6/2002 | Miles |
| 2002/0114558 A1 | 8/2002 | Nemirovsky |
| 2002/0126364 A1 | 9/2002 | Miles |
| 2002/0139981 A1 | 10/2002 | Young |
| 2002/0146200 A1 | 10/2002 | Kudrle et al. |
| 2002/0149828 A1 | 10/2002 | Miles |
| 2002/0149850 A1 | 10/2002 | Heffner et al. |
| 2002/0167072 A1 | 11/2002 | Andosca |
| 2002/0167730 A1 | 11/2002 | Needham et al. |
| 2002/0186483 A1 | 12/2002 | Hagelin et al. |
| 2003/0015936 A1 | 1/2003 | Yoon et al. |
| 2003/0016428 A1 | 1/2003 | Kato et al. |
| 2003/0029705 A1 | 2/2003 | Qiu et al. |
| 2003/0043157 A1 | 3/2003 | Miles |
| 2003/0053078 A1 | 3/2003 | Missey et al. |
| 2003/0072070 A1 | 4/2003 | Miles |
| 2003/0156315 A1 | 8/2003 | Li et al. |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1* | 3/2004 | Strumpell et al. ............ 438/200 |
| 2004/0051929 A1 | 3/2004 | Sampsell et al. |
| 2004/0056742 A1 | 3/2004 | Dabbaj |
| 2004/0058532 A1 | 3/2004 | Miles et al. |
| 2004/0075967 A1 | 4/2004 | Lynch et al. |
| 2004/0080035 A1 | 4/2004 | Delapierre |
| 2004/0080807 A1 | 4/2004 | Chen et al. |
| 2004/0100594 A1 | 5/2004 | Huibers et al. |
| 2004/0100677 A1 | 5/2004 | Huibers et al. |
| 2004/0100680 A1 | 5/2004 | Huibers et al. |
| 2004/0124483 A1 | 7/2004 | Partridge et al. |
| 2004/0125281 A1 | 7/2004 | Lin et al. |
| 2004/0125282 A1 | 7/2004 | Lin et al. |
| 2004/0125347 A1 | 7/2004 | Patel et al. |
| 2004/0136045 A1 | 7/2004 | Tran |
| 2004/0140557 A1 | 7/2004 | Sun et al. |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard et al. |
| 2004/0150939 A1 | 8/2004 | Huff |
| 2004/0159629 A1* | 8/2004 | Busta .......................... 216/22 |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park et al. |
| 2004/0184766 A1 | 9/2004 | Kim et al. |
| 2004/0201908 A1 | 10/2004 | Kaneko |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichi et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0233503 A1 | 11/2004 | Kimura |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0002082 A1 | 1/2005 | Miles |
| 2005/0003667 A1 | 1/2005 | Lin et al. |
| 2005/0014374 A1 | 1/2005 | Partridge et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0157364 A1 | 7/2005 | Lin |
| 2005/0168849 A1 | 8/2005 | Lin |
| 2005/0195462 A1 | 9/2005 | Lin |
| 2005/0195467 A1 | 9/2005 | Kothari et al. |
| 2005/0202649 A1 | 9/2005 | Hung et al. |
| 2005/0249966 A1 | 11/2005 | Tung et al. |
| 2006/0007517 A1 | 1/2006 | Tsai |
| 2006/0044654 A1 | 3/2006 | Vandorpe et al. |
| 2006/0066599 A1 | 3/2006 | Chui |
| 2006/0066640 A1 | 3/2006 | Kothari et al. |
| 2006/0066935 A1 | 3/2006 | Cummings et al. |
| 2006/0067643 A1 | 3/2006 | Chui |
| 2006/0077155 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings et al. |
| 2006/0077516 A1 | 4/2006 | Kothari |
| 2006/0077533 A1 | 4/2006 | Miles et al. |
| 2006/0139723 A9 | 6/2006 | Miles |
| 2006/0220160 A1 | 10/2006 | Miles |
| 2006/0262126 A1 | 11/2006 | Miles |
| 2006/0262380 A1 | 11/2006 | Miles |
| 2006/0268388 A1 | 11/2006 | Miles |

| | | | |
|---|---|---|---|
| 2006/0274074 | A1 | 12/2006 | Miles |
| 2007/0177247 | A1 | 8/2007 | Miles |
| 2008/0037093 | A1 | 2/2008 | Miles |
| 2008/0088904 | A1 | 4/2008 | Miles |
| 2008/0088910 | A1 | 4/2008 | Miles |
| 2008/0088911 | A1 | 4/2008 | Miles |
| 2008/0088912 | A1 | 4/2008 | Miles |
| 2008/0106782 | A1 | 5/2008 | Miles |

FOREIGN PATENT DOCUMENTS

| | | |
|---|---|---|
| DE | 10228946 A1 | 1/2004 |
| EP | 0 310 176 A2 | 4/1989 |
| EP | 0 361 981 | 4/1990 |
| EP | 0 667 548 A1 | 8/1995 |
| EP | 0 788 005 A2 | 8/1997 |
| EP | 1275997 | 1/2003 |
| EP | 1 435 336 A2 | 7/2004 |
| EP | 1 473 581 A2 | 11/2004 |
| EP | 1 473 691 A2 | 11/2004 |
| EP | 1484635 | 12/2004 |
| FR | 2 824 643 A | 11/2002 |
| JP | 62 082454 | 4/1987 |
| JP | 05-275401 | 10/1993 |
| JP | 9-127439 | 5/1997 |
| JP | 11-211999 | 8/1999 |
| JP | 11211999 A | 11/1999 |
| JP | 2000306515 A | 11/2000 |
| JP | 2001-221913 | 8/2001 |
| JP | 2002-062490 | 2/2002 |
| JP | 2002-221678 | 8/2002 |
| JP | 2002-277771 A | 9/2002 |
| JP | 2003-195201 A | 7/2003 |
| JP | 2004-157527 A | 6/2004 |
| JP | 2004-212638 | 7/2004 |
| JP | 2004-212680 | 7/2004 |
| JP | 2004-235465 A | 8/2004 |
| JP | 2004-286825 A | 10/2004 |
| TW | 157313 | 5/1991 |
| WO | WO 95/30924 A1 | 11/1995 |
| WO | WO 97/17628 A1 | 5/1997 |
| WO | WO 99/52006 A2 | 10/1999 |
| WO | WO 99/52006 A3 | 10/1999 |
| WO | WO 02/079853 | 10/2002 |
| WO | WO 03/007049 A1 | 1/2003 |
| WO | WO 03/014789 A2 | 2/2003 |
| WO | WO03/054925 | 7/2003 |
| WO | WO 03/054925 A2 | 7/2003 |
| WO | WO 03/069404 | 8/2003 |
| WO | WO03/069413 A | 8/2003 |
| WO | WO 03/069413 A1 | 8/2003 |
| WO | WO 03/073151 A1 | 9/2003 |
| WO | WO 03/085728 A1 | 10/2003 |
| WO | WO 2004/006003 A1 | 1/2004 |
| WO | WO 2004/026757 A2 | 4/2004 |
| WO | WO 2005/006364 A1 | 1/2005 |
| WO | WO 2006/014929 | 2/2006 |

OTHER PUBLICATIONS

Kim et al., "Control of Optical Transmission Through metals Perforated With Subwave-Length Hole Arrays," Optic Letters, vol. 24, No. 4, Feb. 15, 1999, pp. 256-257.
Lin et al., "Free-Space Michromachined Optical Switches for Optical Networking," IEEE Journal of Selected Topics in Quantum Electronics, vol. 5, No. 1m Jan./Feb. 1999, pp. 4-9.
Little et al., "Vertically Coupled Microring Resonator Channel Dropping Filter," IEEE Photonics Technology Letters, vol. 11, No. 2, 1999.
Magel, "Integrated Optic Devices Using Micromachined Metal Membranes," SPIE vol. 2686, 0-8194-2060-3/1996.
Science and Technology, The Economist, May 22, 1999, pp. 89-90.
International Search Report and Written Opinion of the International Searching Authority for PCT/US2005/005919 dated Aug. 24, 2005.
International Search Report Application No. PCT/US2005/026448, Dated Nov. 23, 2005.
International Search Report Application No. PCT/US2005/029820, Dated Dec. 27, 2005.
International Search Report Application No. PCT/US2005/030962, Dated Aug. 31, 2005.
International Search Report Application No. PCT/US2005/034465, Dated Sep. 23, 2005.
European Search Report Application No. 05255693.3-2217, dated May 24, 2006.
European Search Report Application No. EP 05 25 5673 in 9 pages, dated Jan. 23, 2006.
Austrian Search Report No. 140/2005, Dated Jul. 15, 2005.
Austrian Search Report No. 161/2005, Dated Jul. 15, 2005.
Austrian Search Report No. 162/2005, Dated Jul. 14, 2005.
Austrian Search Report No. 164/2005, Dated Jul. 4, 2005.
Austrian Search Report No. 150/2005, Dated Jul. 29, 2005.
Austrian Search Report No. 144/2005, Dated Aug. 11, 2005.
Austrian Search Report No. 66/2005, Dated May 9, 2005.
Akasaka, "Three-Dimensional IC Trends," Proceedings of IEEE, vol. 74, No. 12, pp. 1703-1714, (Dec. 1986).
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Aratani K., et al., "Surface micromachined tuneable interferometer array," Sensors and Actuators, pp. 17-23. (1994).
Bass, "Handbook of Optics, vol. 1, Fundamentals, Techniques, and Design, Second Edition," McGraw-Hill, Inc., New York, pp. 2.29-2. 36 (1995).
Bulter et al., "An Embedded Overlay Concept for Microsystems Packaging," IEEE Transactions on Advanced Packaging IEEE USA, vol. 23, No. 4, pp. 617-622, XP002379648 (2000).
Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), pp. 319-324, (Oct. 29, 2001).
Chunjun Wang et al., "Flexible curcuit-based *RF MEMS Switches*," *MEMS*. XP002379649 pp. 757-762, (Nov. 2001).
*Circle*, "Light over Matter," No. 36, ( Jun. 1993).
Conner, "Hybrid Color Display Using Optical Interference Filter Array," SID Digest, pp. 577-580 (1993).
Giles et al., "A Silicon MEMS Optical Switch Attenuator and Its Use in Lightwave Subsystems," IEEE Journal of Selected Topics in Quantum Electronics, vol. 5, No. 1, pp. 18-25, (Jan./Feb. 1999).
Goossen et al., "Possible Display Applications of the Silicon Mechanical Anti-Reflection Switch," Society for Information Display, (1994).
Goossen et al., "Silicon Modulator Based on Mechanically-Active Anti-Reflection Layer with 1Mbit/sec Capability for Fiber-in-the-Loop Applications," IEEE Photonics Technology Letters, No. 9, pp. 1119-1121 (Sep. 1994).
Goossen, "MEMS-based variable optical interference devices," Optical MEMS, 2000 IEEE/LEDS Int'l. Conf. on Aug. 21-24, 2000, Piscatawny, NJ, pp. 17-18, (Aug. 21, 2000).
Gosch, "West Germany Grabs the Lead in X-Ray Lithography," Electronics, pp. 78-80, (Feb. 5, 1987).
Howard et al., "Nanometer-Scale Fabrication Techniques", VLSI Electronics: Microstructure Science, vol. 5, pp. 145-153 and pp. 166-173, (1982).
Ibbotson et al., "Comparison of XeF2 and F-atom reactions with Si and Si02," Applied Physics Letters, vol. 44, No. 12, pp. 1129-1131, (Jun. 1984).
Jackson "Classical Electrodynamics", John Wiley & Sons Inc., pp. 568-573. (1998).
Jerman et al., "A Miniature Fabry-Perot Interferometer with a Corrugated Silicon Diaphragm Support," IEEE, (1990).
Jerman et al., "A miniature fabry-perot interferometer fabricated using silicon micromachining techniques," Technical Digest of the 1988 IEEE Solid-State Sensors Workshop, (1988).
Johnson "Optical Scanners", Microwave Scanning Antennas, R.C. Hansen ed., Academic Press, vol. 1, p. 251-261, (1964).

Joannopoulos et al., "*Molding the Flow of Light,*" *Photonic Crystals.* 1995.

*Laser Focus World*, "Newsbreaks: Quantum-trench devices might operate at terahertz frequencies," pp. 13, (May 1993).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfigurable Computing for General-Purpose," Proc. IEEE Workshop on FPGA-based Custom Computing Machines, (1998).

Oliner et al., "Radiating Elements and Mutual Coupling", Microwave Scanning Antennas, R.C. Hansen ed., Academic Press, vol. 2, pp. 131-194, (1966).

Peerlings et al., "Long Resonator Micromachined Tunable GaAs-AlAs Fabry-Perot Filter," IEEE Photonics Technology Letters, IEEE Service Center, Piscatawny, NJ, vol. 9, No. 9, pp. 1235-1237, (Sep. 1997).

Raley et al., "A Fabry-Perot Microinterferometer for Visible Wavelengths," IEEE Solid-State Sensor and Actuator Workshop, Hilton Head, SC, pp. 170-173, (Jun. 1992).

Schnakenberg, et al., "TMAHW Etchants for Silicon Micromachining," 1991 International Conference on Solid State Sensors and Actuators-Digest of Technical Papers, pp. 815-818, (1991).

Sperger et al., "High Performance Patterned All-Dielectric Interference Colour Filter for Display Applications," SID Digest, pp. 81-83, (1994).

Stone, "Radiation and Optics, An Introduction to the Classical Theory", McGraw-Hill, pp. 340-343, (1963).

Walker, et al., "Electron-beam-tunable Interference Filter Spatial Light Modulator," Optics Letters, vol. 13, No. 5, pp. 345-347, (May 1988).

Williams, et al., "Etch Rates for Micromachining Processing," Journal of Microelectromechanical Systems, vol. 5, No. 4, pp. 256-259, (Dec. 1996).

Winters, et al., "The etching of silicon with $XeF_2$ vapor," Applied Physics Letters, vol. 34, No. 1, pp. 70-73, (Jan. 1979).

Winton, John M., "A novel way to capture solar energy", Chemical Week, (May 1985).

Wu, "Design of a Reflective Color LCD Using Optical Interference Reflectors," ASIA Display '95, pp. 929-931, (Oct. 1995).

Wu., "MEMS Designed for Tunable Capacitors," Microwave Symposium Digest, 1998 IEEE MTT-S Int'l., Baltimore, MD, vol. 1, pp. 127-129, (Jun. 7-12, 1998).

Zhou et al., "Waveguide Panel Display Using Electromechanical Spatial Modulators," SID Digest, vol. XXIX, 1998.

European Search Report dated May 29, 2008 cited in European Patent Application No. 05255697.4, filed Sep. 14, 2005.

\* cited by examiner

|  | + $V_{bias}$ | - $V_{bias}$ |
|---|---|---|
| 0 | Stable | Stable |
| + ΔV | Release | Actuate |
| − ΔV | Actuate | Release |

Column Output Signals (top), Row Output Signals (left)

METHOD OF MAKING PRESTRUCTURE FOR MEMS SYSTEMS

RELATED APPLICATIONS

This application claims priority under 35 U.S.C. § 119(e) to U.S. Provisional Application Ser. No. 60/613,411, filed on Sep. 27, 2004, which is hereby incorporated by reference in its entirety.

BACKGROUND

1. Field of the Invention

The field of the invention relates to microelectromechanical systems (MEMS).

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

In one embodiment, a method of forming an interferometric display element is provided, including providing a substrate, depositing a layer of support post material over the substrate, patterning the layer of support post material to form at least two support posts, forming an electrode layer over the substrate, where the forming of the electrode layer is done after the forming of the at least two support posts, forming at least a first sacrificial layer over the electrode layer, and forming a mechanical layer over the sacrificial layer, where the mechanical layer covers a portion of each of the at least two support posts.

In another embodiment, an apparatus including a plurality of interferometric modulator elements is provided, where the interferometric modulator elements include an electrode layer located over the substrate, at least two support posts located on the substrate, and a mechanical layer located over the electrode layer, where the mechanical layer is supported by at least two support posts.

In another embodiment, a method of forming an interferometric display element is provided, including providing a substrate, forming an electrode layer over the substrate, forming at least two support posts over the substrate, wherein the forming of the at least two support posts is done after the forming of the electrode layer, forming at least a first sacrificial layer over the electrode layer, and forming a mechanical layer over the sacrificial layer, where the mechanical layer covers a portion of each of the at least two support posts.

In another embodiment, a display including a plurality of interferometric display elements is provided, where said interferometric display elements include a substrate, an electrode layer located over the substrate, at least two support posts located on the electrode layer, where the posts include planarization material, and a mechanical layer located over the electrode layer, said mechanical layer being supported by the at least two support posts.

In another embodiment, a display containing a plurality of interferometric modulators is provided, where the interferometric modulators are formed by a method including providing a substrate, depositing a layer of support post material over the substrate, patterning the layer of support post material to form at least two support posts, forming an electrode layer over the substrate, where the forming of the electrode layer is done after the forming of the at least two support posts, forming at least a first sacrificial layer over the electrode layer, and forming a mechanical layer over the sacrificial layer, where the mechanical layer covers a portion of each of the at least two support posts.

In another embodiment, a method of making an interferometric display element is provided, including providing a substrate, forming support posts over the substrate, forming an electrode layer over the substrate, depositing a sacrificial layer over the electrode layer forming a substantially planar surface over the sacrificial layer, forming a mechanical layer over the substantially planar surface, forming an insulator layer over at least part of the mechanical layer; and forming a substantially rigid support layer over the insulation layer.

In another embodiment, an apparatus is provided, including a substrate, an electrode layer located over the substrate, a plurality of support posts located over the substrate, a rigid cap member located over each of at least some of the plurality of support posts, where the rigid cap member includes an insulator layer, and a mechanical layer located over the partially reflective electrode layer, where said mechanical layer is attached to the insulator layers of at least two rigid cap members.

In another embodiment, a method of making a display element is provided, including depositing an electrode layer on a substrate, patterning the electrode layer, depositing a layer of sacrificial material over the electrode layer, patterning the layer of sacrificial material to form apertures, forming support posts in the apertures, forming a flexible layer over the layer of sacrificial material, depositing an insulator layer over the flexible layer, depositing a rigid support layer over the insulator layer; and removing the sacrificial material; thereby permitting movement of the flexible layer relative to the substrate.

In yet another embodiment, a method of making a display element is provided, including depositing an electrode layer on a substrate, patterning the electrode layer, depositing a layer of sacrificial material over the electrode layer, patterning the layer of sacrificial material to form apertures, depositing a layer of non-planarizing support post material on the sacrificial material, and patterning the non-planarizing support post material so as to remove support post material located away from the apertures, forming support posts, forming a flexible layer over the support posts, and removing the sacrificial material; permitting movement of the flexible layer relative to the substrate.

In yet another embodiment, a display containing a plurality of interferometric modulators is provided, where the interferometric modulators are formed by a method including providing a substrate, forming support posts over the substrate forming an electrode layer over the substrate, depositing a sacrificial layer over the electrode layer, forming a substantially planar surface over the sacrificial layer, forming a mechanical layer over the substantially planar surface, forming an insulator layer over at least part of the mechanical layer, and forming a substantially rigid support layer over the insulation layer.

DETAILED DESCRIPTION OF CERTAIN EMBODIMENTS

Figure 1:
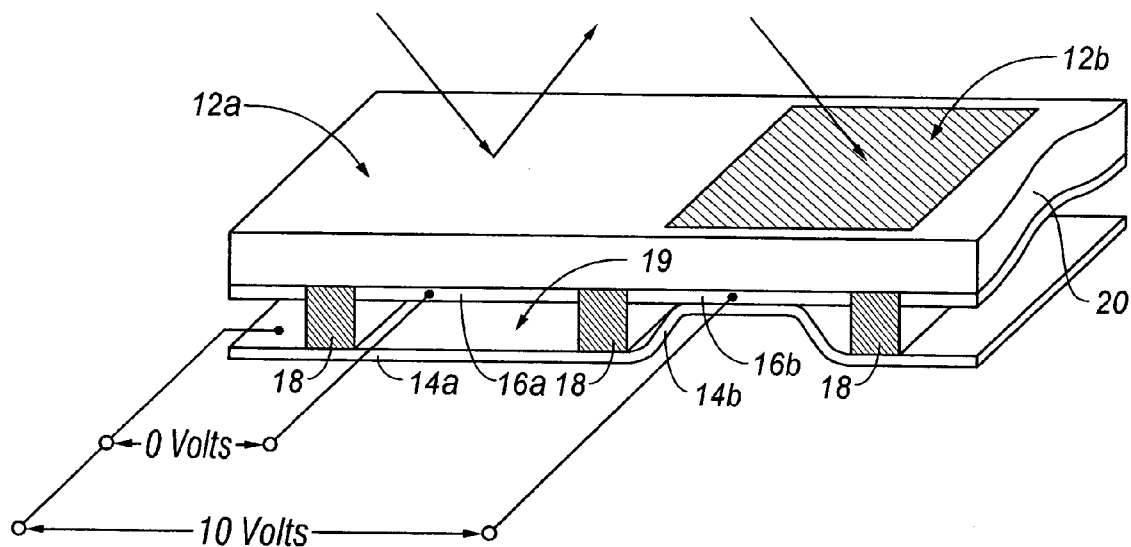
FIG. 1 is an isometric view depicting a portion of one embodiment of an interferometric modulator display in which a movable reflective layer of a first interferometric modulator is in a released position and a movable reflective layer of a second interferometric modulator is in an actuated position.

An embodiment of the invention, as discussed in greater detail below, is an interferometric modulator element which includes an upper mechanical layer supported by at least two support posts. In one embodiment, these support posts are formed on a substrate before other layers are deposited on the substrate. Such a method advantageously permits the use of spin-on glass support posts, and other materials which must be annealed at a temperature high enough to damage other components of the interferometric modulator if those components were deposited before the annealing of the post.

In other embodiments, support posts made from materials with lower annealing temperatures may be formed after the deposition of certain layers of materials having higher annealing temperatures, permitting the creation of support posts over these layers. Such an embodiment advantageously minimizes or eliminates the need for a masking layer between the posts and the viewer, as the layers on which the support posts rest may prevent the support posts from reflecting light back to the viewer.

Another embodiment of the invention, as discussed in greater detail below, is a method of making an interferometric modulator element which includes a rigid cap portion atop at least two support posts. The method may also include providing a substantially planar surface on which the mechanical layer can be formed. The use of a cap portion advantageously provides additional rigidity to the support posts. In addition, the use of a rigid cap portion advantageously permits the use of thin support posts, providing the necessary surface area to support and electrically isolate adjacent mechanical layers. The use of a substantially flat mechanical layer advantageously prevents problems such as delamination between the support post and the mechanical layer, or damage to the edge of the support post, which might otherwise occur over time as a result of the residual tensile stresses in a non-flat mechanical layer. Thus, this invention provides a modulator having improved greater color accuracy over a longer period of time.

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a relaxed position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
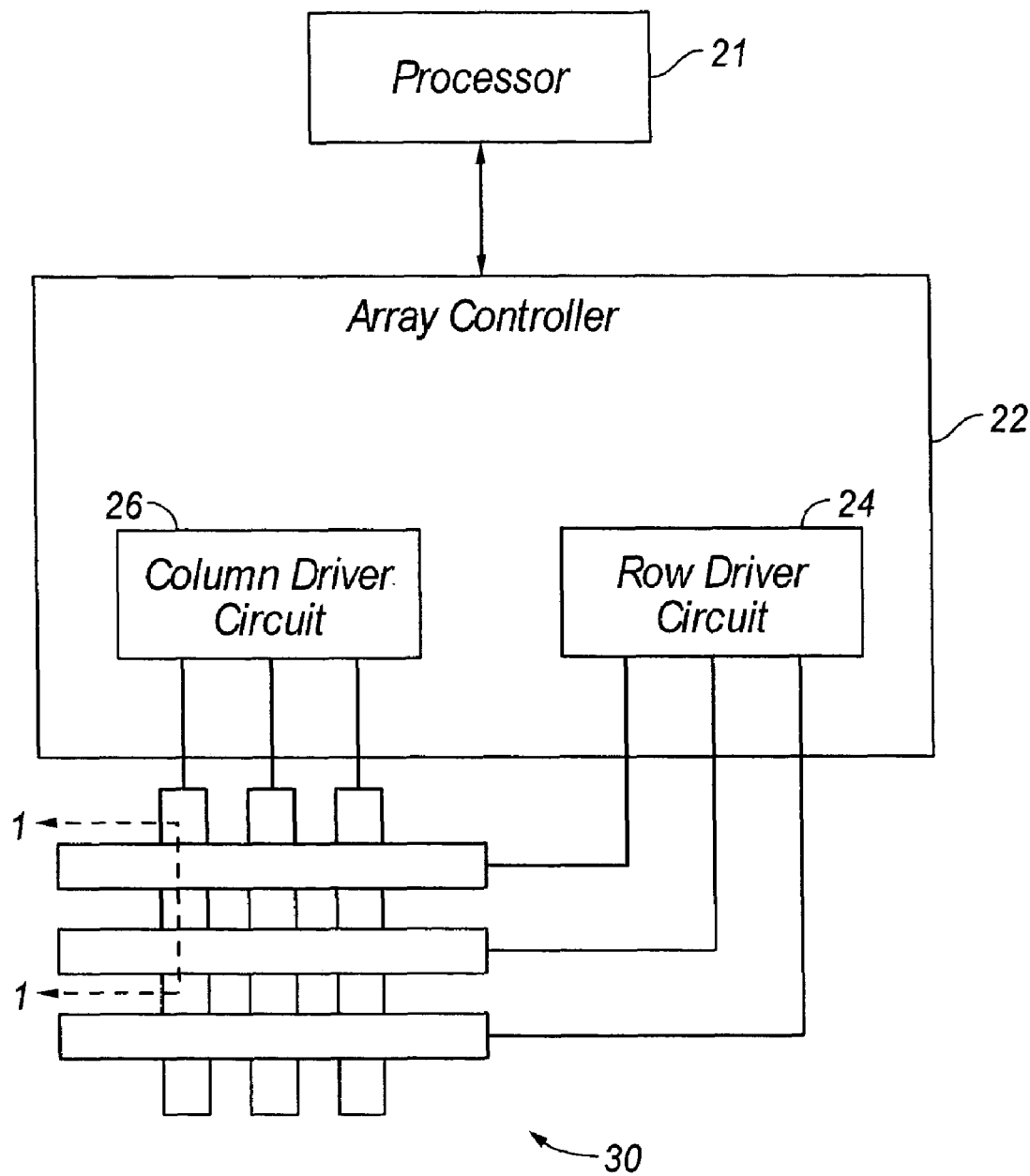
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
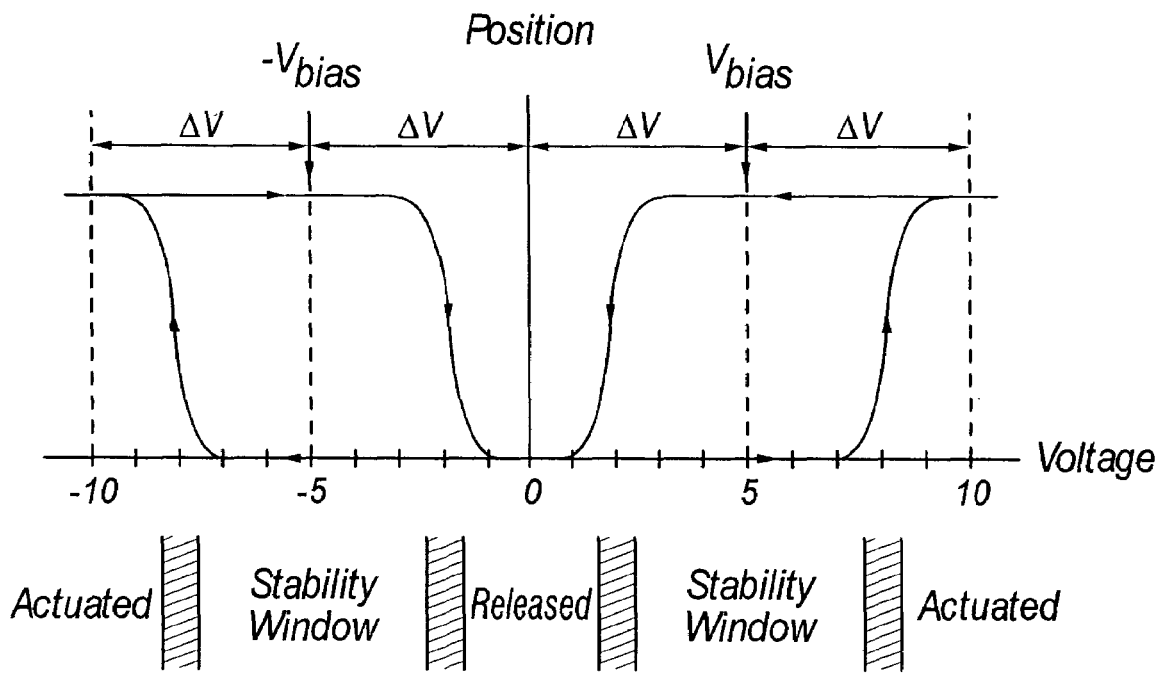
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
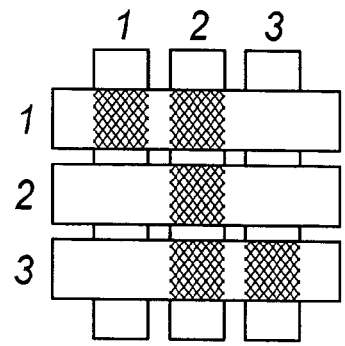
FIGS. 5A and 5B illustrate one exemplary timing diagram for row and column signals that may be used to write a frame of display data to the 3×3 interferometric modulator display of FIG. 2.
Figure 5B:
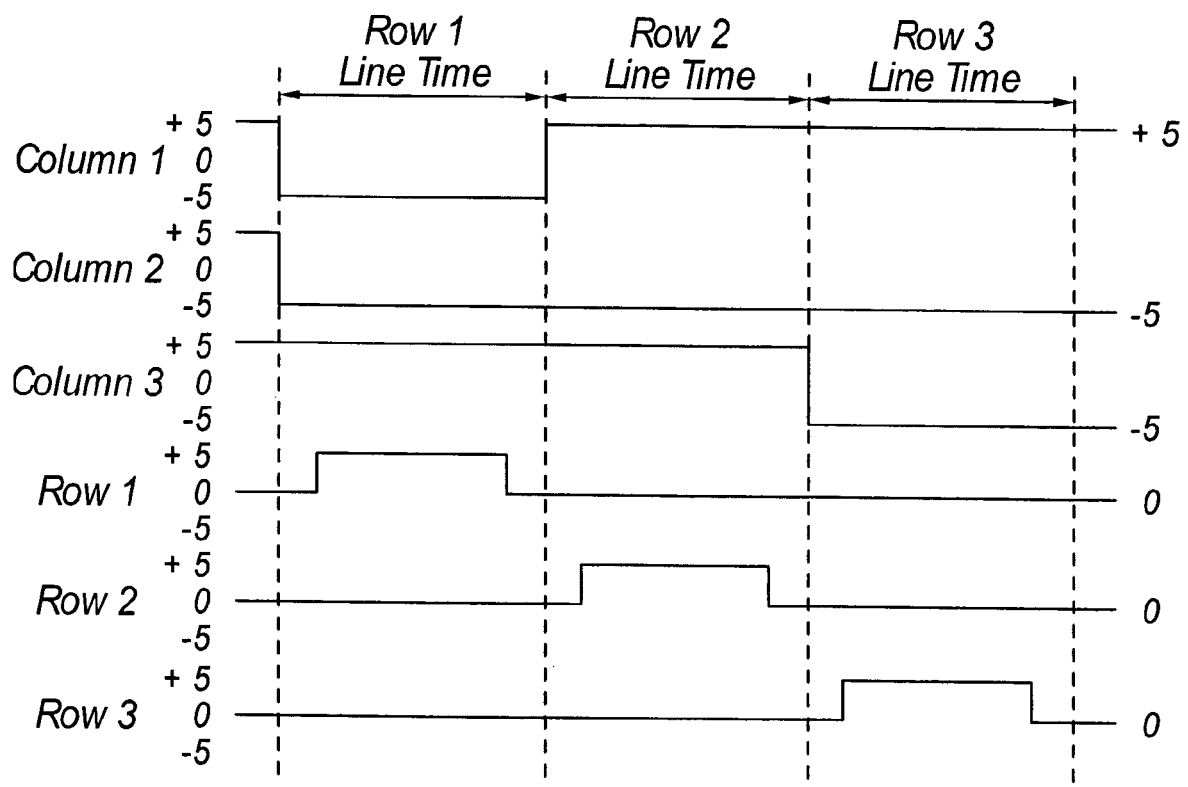

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 18A:
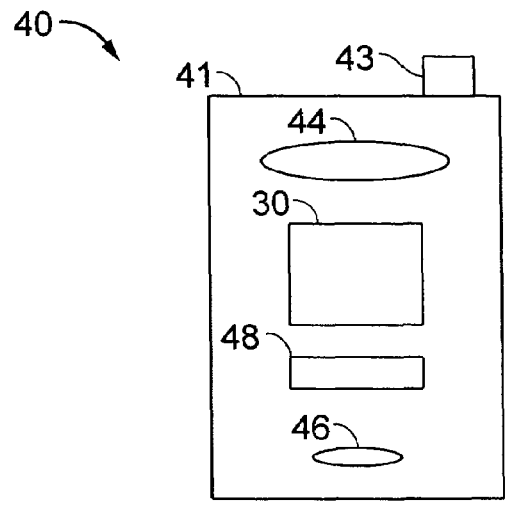
FIGS. 18A-18B are system block diagrams illustrating an embodiment of a display device.
Figure 18B:
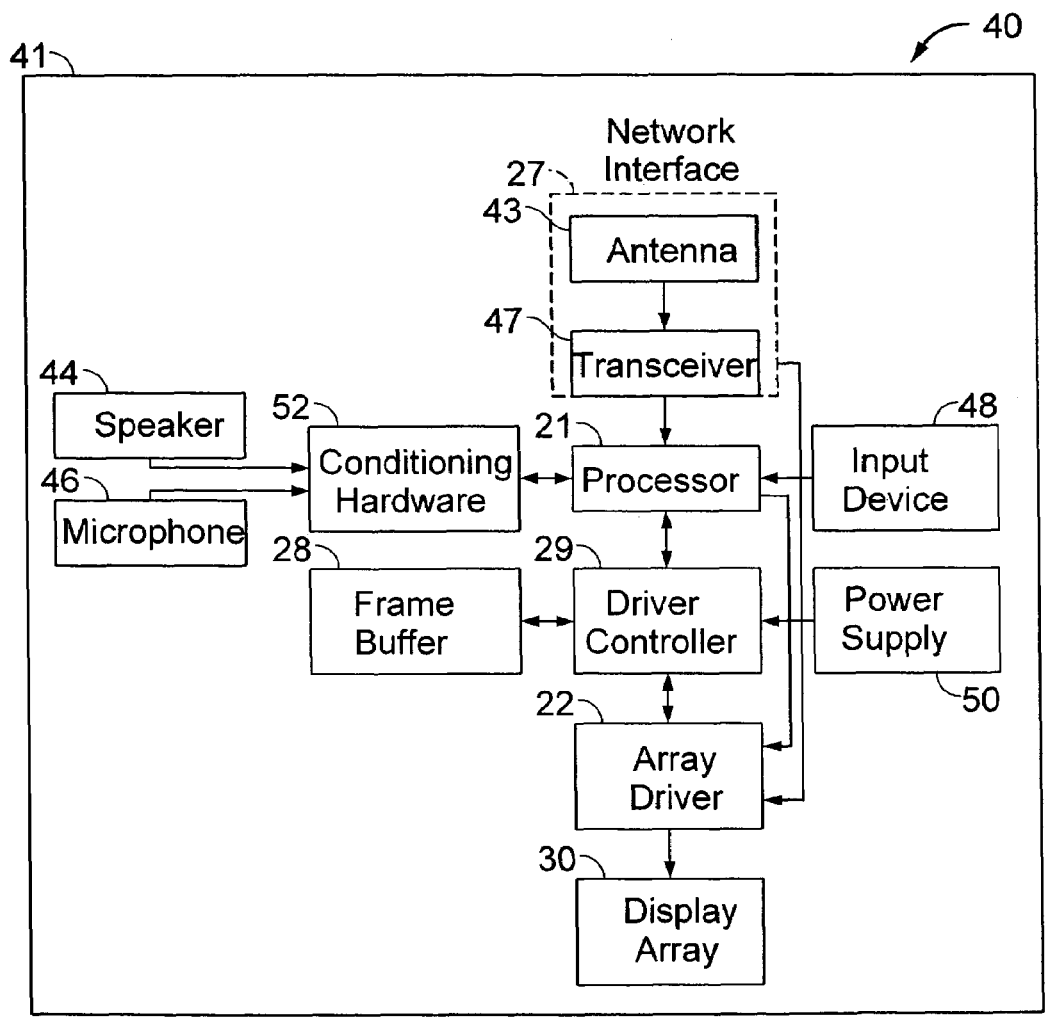

FIGS. 18A and 18B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 18B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. [The conditioning hardware 52 may be configured to condition a signal (e.g. filter a signal).] The conditioning hardware 52 is connected to a speaker 44 and a microphone 46. The processor 21 is also connected to an input device 48 and a driver controller 29. The driver controller 29 is coupled to a frame buffer 28, and to an array driver 22, which in turn is coupled to a display array 30.

A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 44, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 6A:
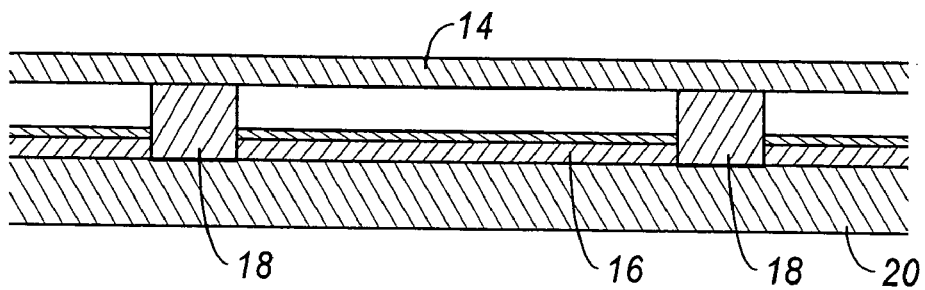
FIG. 6A is a cross section of the device of FIG. 1.
Figure 6B:
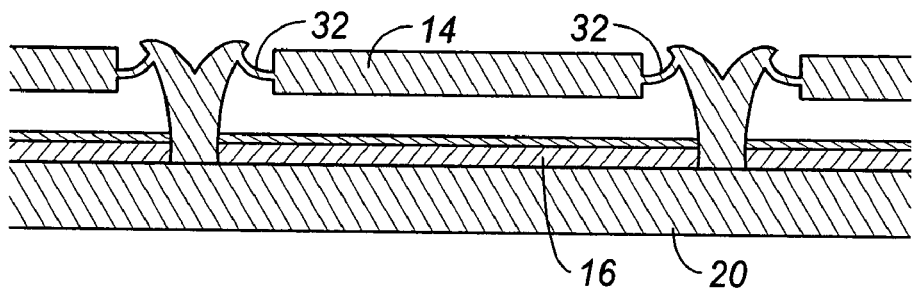
FIG. 6B is a cross section of an alternative embodiment of an interferometric modulator.
Figure 6C:
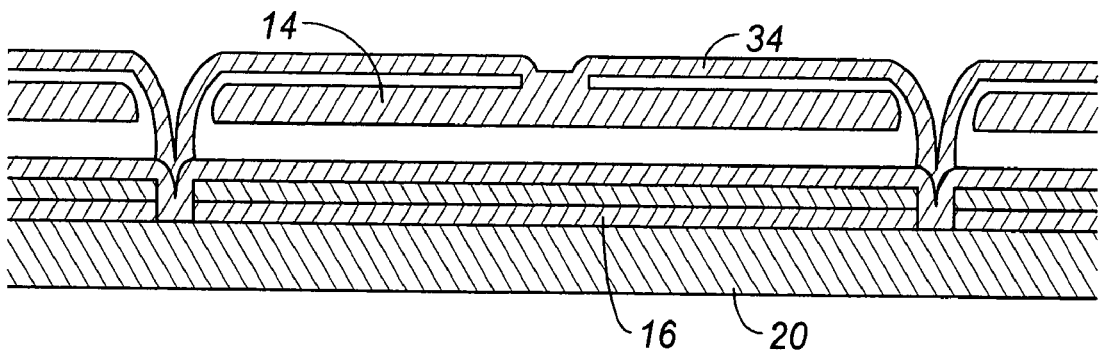
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of known techniques may be used to produce the above described structures involving a series of material deposition, patterning, and etching steps.

Figure 7:
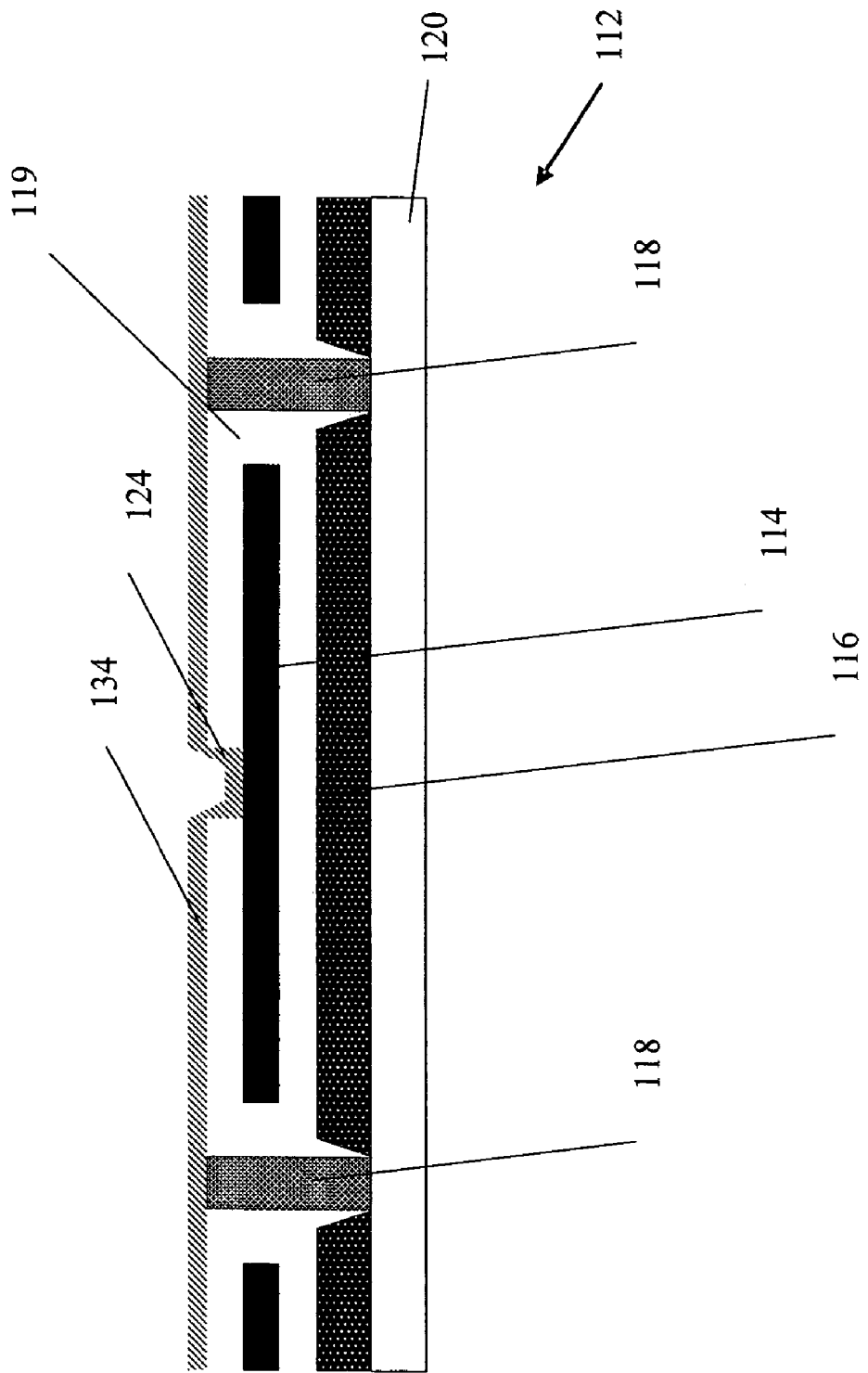
FIG. 7 is a cross section of an embodiment of an interferometric modulator element, similar to the interferometric modulator of FIG. 6C.

FIG. 7 is a cross-sectional illustration of an embodiment of an interferometric modulator element 112, which is similar in structure to the modulator element of FIG. 6C. The modulator element 112 includes a fixed mirror layer within an optical stack 116 formed on a transparent substrate 120. As will be discussed in greater detail below, the optical stack 116 may comprise two or more distinct layers. In one embodiment, the optical stack 116 comprises an indium tin oxide (ITO) layer underneath a layer of chrome. In further embodiments, the optical stack 116 may comprise an oxide layer located over the chrome layer. The optical stack 116 is alternately referred to herein as the electrode layer. On either side of the optical stack 116, posts 118 extend upward from the substrate 120 and support a flexible layer 134, alternately referred to herein as a deformable layer or a mechanical layer. The flexible layer 134 is electrically and physically connected to a movable mirror layer 114 via a conductive member 124. An interferometric cavity 119 is thus formed between the movable mirror 114 and the fixed mirror within the optical stack 116.

As discussed with respect to previous embodiments, the application of a voltage to both the movable mirror 114 and the fixed mirror will result in an electrostatic force between layers 114 and 116 causing the flexible layer 134 to deflect, so as to permit the movable mirror 114 to move closer to the optical stack 116. When the applied voltage is changed, the movable mirror 114 can move closer or further from the optical stack 116, depending on the change in voltage. It is desirable that the posts 118 that support the flexible layer 134 be sufficiently stiff that the posts 118 not bend or deflect when the flexible layer 134 deflects.

As will be explained in greater detail below, support posts such as post 118 of FIG. 7 may not be located directly on substrate 120. Although not shown in FIG. 7, the support posts 118 may instead be located on top of one or more of the layers which form the optical stack 116, or on top of a masking layer. As will be apparent from the following detailed description, the existence of layers underlying the support posts will depend in part on the particular methods and materials used to create the interferometric modulator.

The term "support post" encompasses not only the variety of post structures depicted or described with respect to the various embodiments disclosed in the application, but also encompasses any structure suitable for providing support for the flexible layer 134, or similar components of an interferometric modulator element. For example, in certain embodiments, these structures may comprise wall-like structures which are substantially longer in one dimension than they are wide in another. In a further embodiment, two intersecting wall structures may serve as a single support post, such that if the structures were to be viewed from above, they would form a cross. Such alternate structures, which may provide necessary spacing between components supported by such structures, may advantageously also increase the functional area of the display. For convenience, the term support post is used herein to refer to any of these support-providing structures.

Figure 8A:
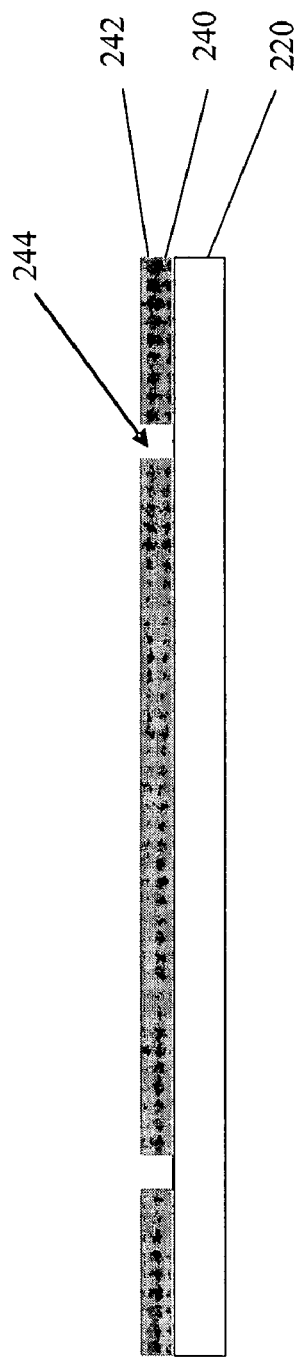
FIGS. 8A-8I are cross sectional views illustrating certain steps of one embodiment of a method of making one embodiment of an interferometric modulator element, such as depicted in FIG. 7.
Figure 8B:
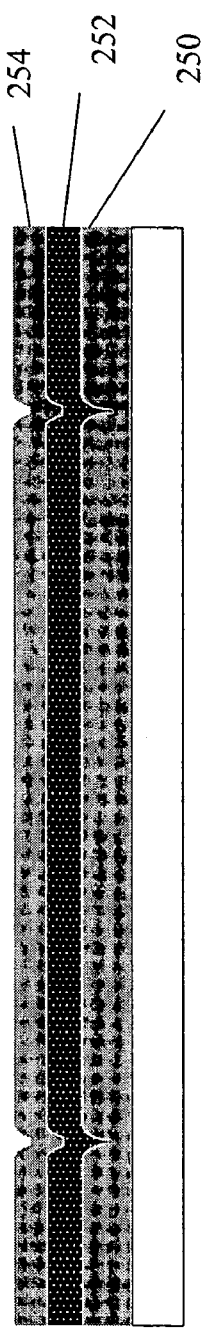

FIGS. 8A-8I depict certain steps of one embodiment of a method of making one embodiment of an interferometric modulator element 112, such as depicted in FIG. 7. Each of FIGS. 8A-8I is a side cross section view of the element 112 illustrating changes as additional layers are deposited, patterned, and etched in forming the interferometric modulator element 112. In one embodiment, the substrate 120 of FIG. 7, onto which the element 112 is formed, includes a glass substrate 220. Each of the layers described herein may comprise any suitable material known in the art. In FIG. 8A, an indium tin oxide (ITO) layer 240, and a chrome layer 242 can be deposited onto the glass substrate 220. These layers are subsequently patterned and etched to define addressing electrodes for individual modulator elements. Typically, posts will be formed in the apertures 244 between the electrodes. Next, as depicted in FIG. 8B, layers of oxide 250, sacrificial material 252, and mirror metal 254 are deposited over the layer 242. Moving to FIG. 8C, a mask layer 256 can be deposited, patterned, and etched to define a post region 258 in the mask layer 256.

Figure 8C:
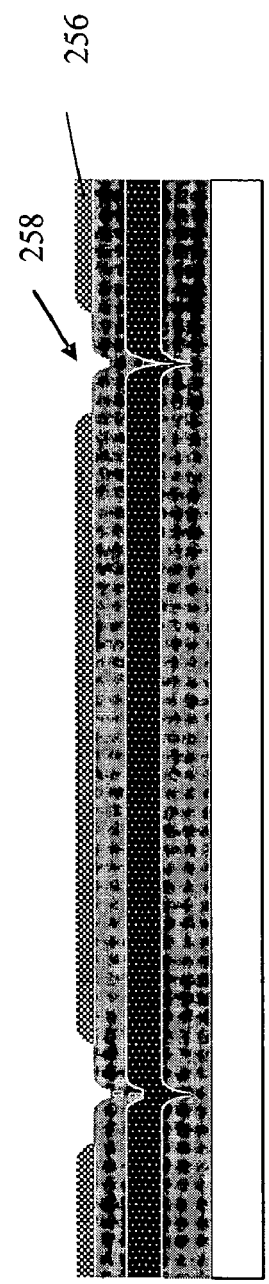
Figure 8D:
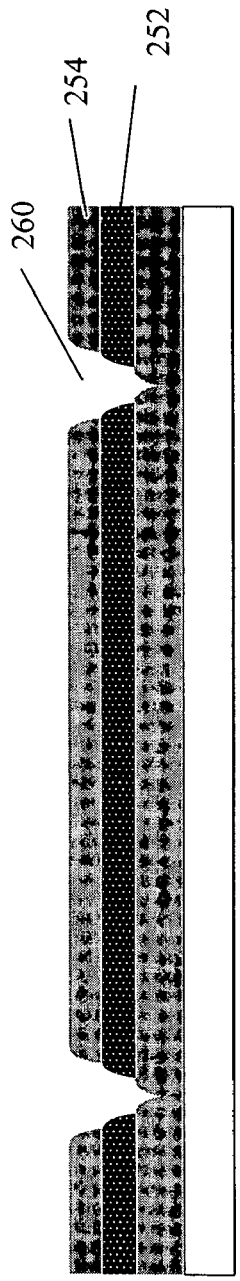
Figure 8E:
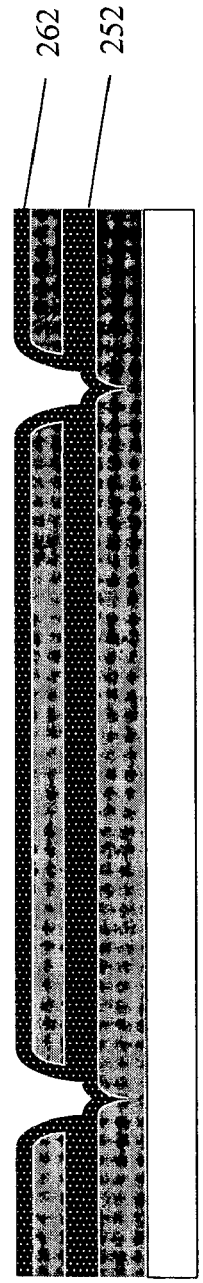

Proceeding to FIG. 8D, layers 254 and 252 are etched using the mask layer 256 of FIG. 8C to form a hole or opening 260 extending through the layers 254 and 252 down to the oxide layer 250, after which the mask layer 256 is removed. While the profile of the opening 260 is depicted as v-shaped in the illustrated embodiment, it is to be recognized that the shape of the opening 260 may vary in other embodiments based on details of the photomasks used or on other details of the photolithography and etching processes used in an embodiment. Next at FIG. 8E, a second sacrificial layer 262 is deposited onto exposed portions of the layers. In one embodiment, the sacrificial layers 252 and 262 include molybdenum. As discussed above, the process in other embodiments may use any suitable material known in the art to accomplish the steps set forth above.

Figure 8F:
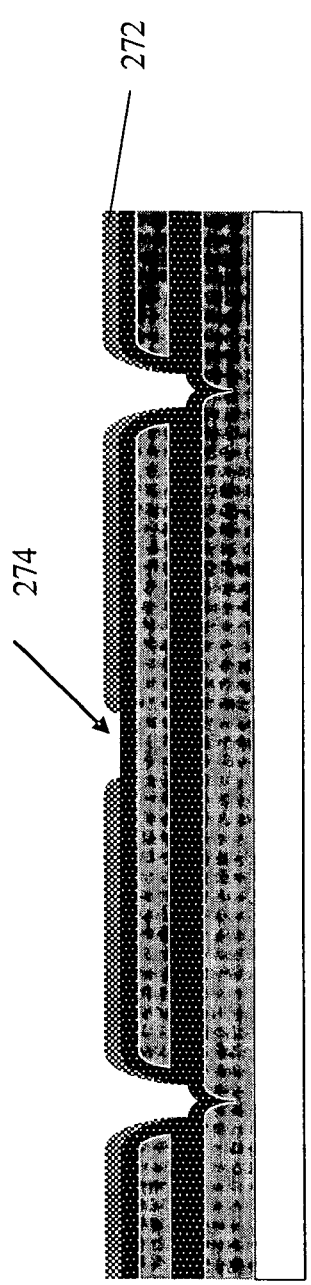

Next in FIG. 8F, a resist layer 272 is deposited on the exposed portions of the layers, patterned, and etched to define an aperture 274 in the resist layer 272. The aperture 274 corresponds to the location of the conductive member 108 that physically and electrically couples the movable mirror 114 to the deflectable membrane 134 of the interferometric modulator element 112 (See FIG. 7). Proceeding to FIG. 8G, the sacrificial layer 262 is etched to define an opening corresponding to the conductive member 124. The resist layer is then removed, and a mechanical layer 282 is deposited on the exposed portions of the layers to form the conductive member 124 and the flexible layer 134 of FIG. 7.

Figure 8G:
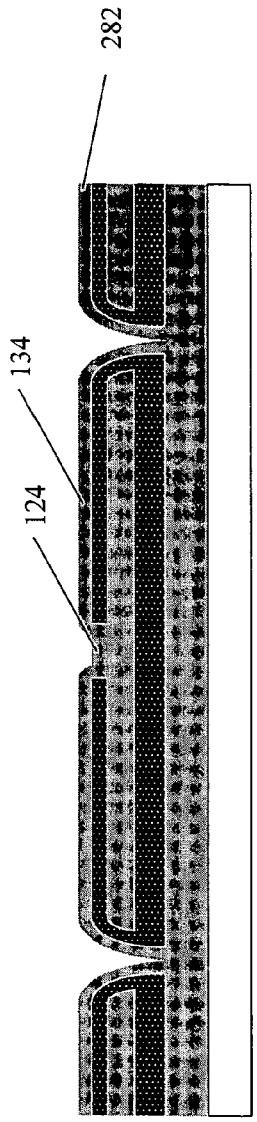
Figure 8H:
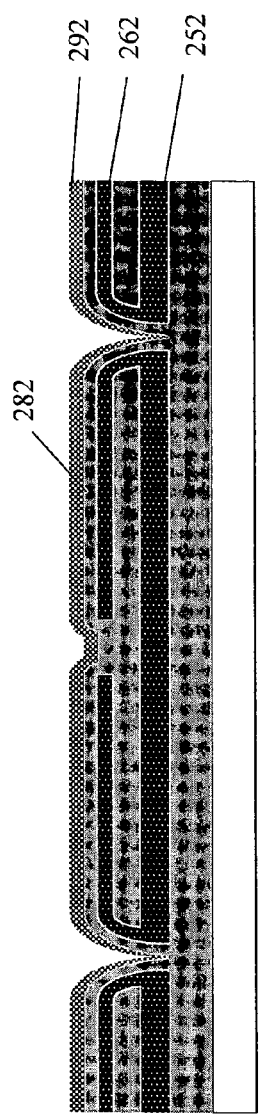

Moving to FIG. 8H, a resist layer 292 is deposited on the mechanical layer 282 and masked to define other structures (not shown) of the mechanical layer. Next at FIG. 8I, the sacrificial layers 252 and 262 (see FIG. 8H) are removed to define the optical cavity of the interferometric modulator element 112 and to separate the movable mirror 114 from the layers below it and, except for conductive member 124, from the layers above it as well. In one embodiment, a xenon diflouride based process is used to remove the sacrificial layers.

As noted above, the post 118 in this embodiment is formed above another layer of material, rather than directly on the substrate as depicted in FIG. 7. In this embodiment, the post 118 is formed over a portion of the oxide layer 250, rather than directly on the substrate 220. The post 118 is thus formed by the mechanical layer 282 of FIG. 8H. However, forming the post opening 260 (as shown in FIG. 8D), as well as forming the mechanical layer 282 into the post opening (as shown in FIG. 8G), requires precise process control that can limit the types of fabrication facility and fabrication equipment that can be used to fabricate the interferometric modulator element 112.

Figure 9A:
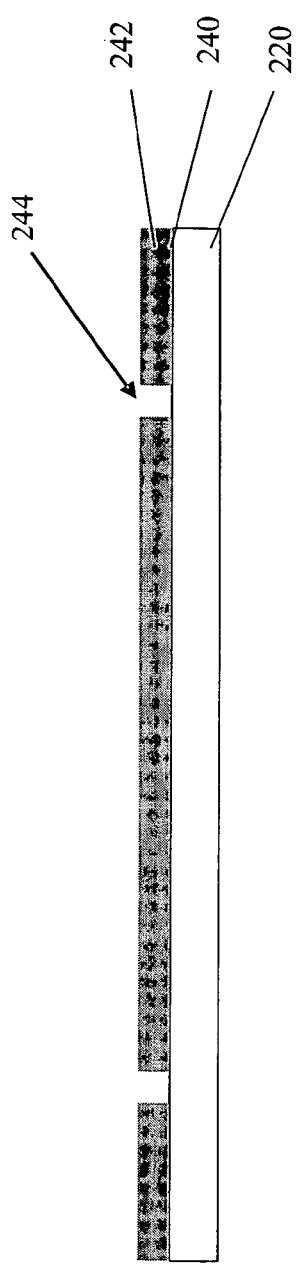
FIGS. 9A-9E are cross-sectional views illustrating certain steps of one embodiment of a method of making one embodiment of an interferometric modulator element in which the deformable layer serves as the movable mirror.
Figure 9B:
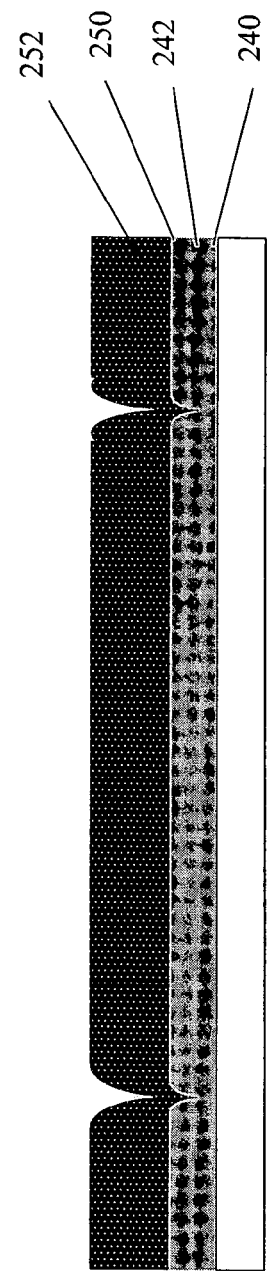

FIGS. 9A-9E are cross-sectional views of certain steps of a method of making an alternate embodiment of an interferometric modulator in which a reflective surface is located on the underside of the flexible layer. As shown in FIG. 9A, a layer 240 of ITO is deposited on a substrate 220, and a layer 242 of chrome is deposited above the ITO layer 240. Layers 240 and 242 are then subsequently patterned and etched to define addressing electrodes for individual modulator elements. Typically, posts will be formed in the apertures 244 between the electrodes. In alternate embodiments, layers 240 and 242 are etched so as to form addressing electrodes but leave material at the post locations, such that the posts will overlie this residual material. In FIG. 9B, it can be seen that a layer 250 of oxide is deposited on top of the chrome layer 242, and a layer of sacrificial material 252 is deposited above the oxide layer 250.

Figure 9C:
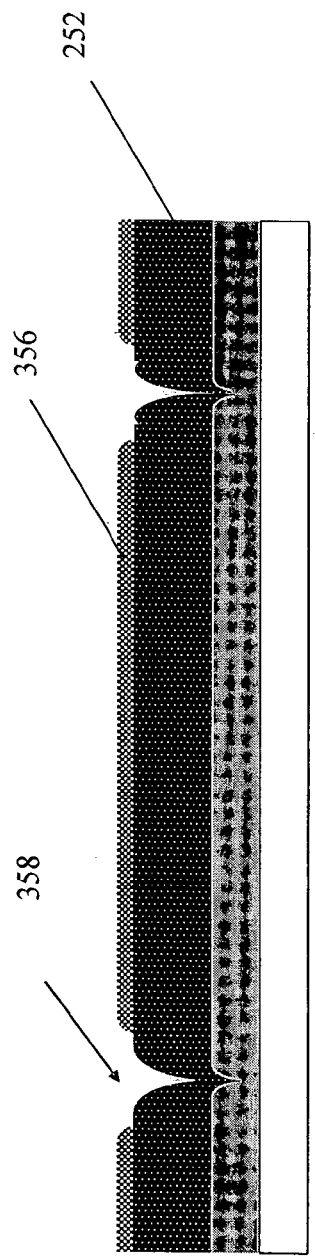
Figure 9D:
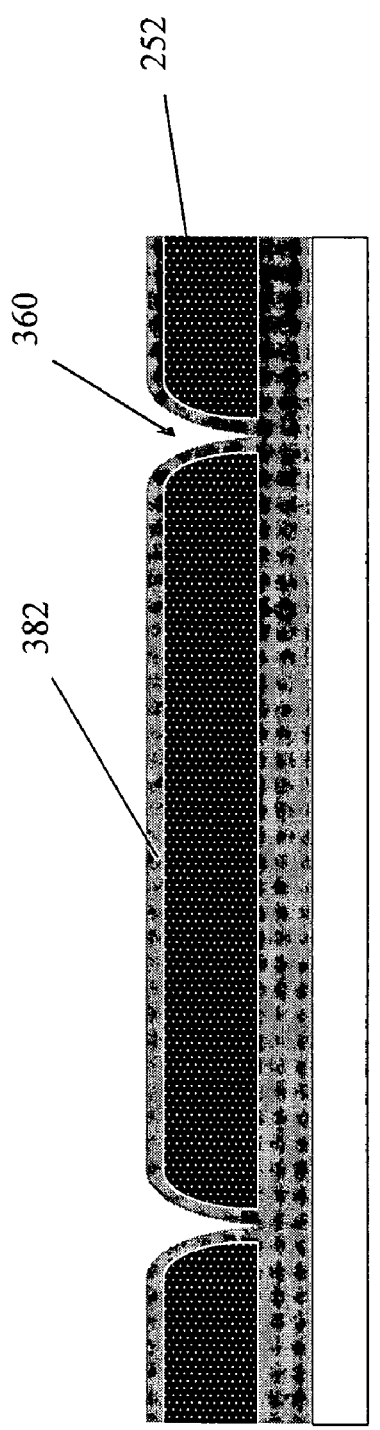
Figure 9E:
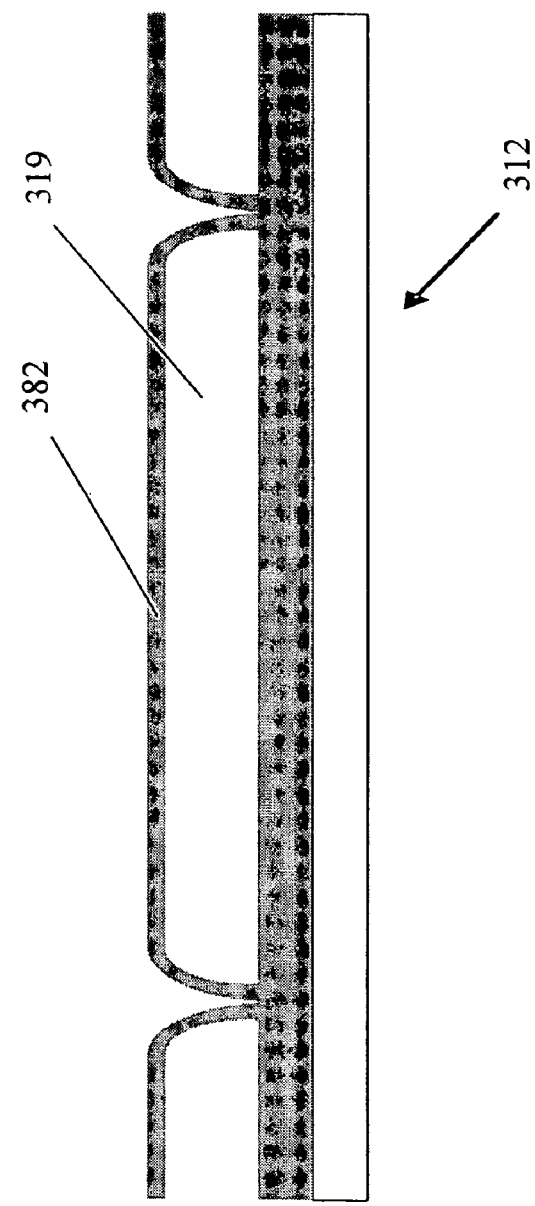

In FIG. 9C, it can be seen that a mask layer 356 has been deposited and patterned to form apertures 358. As seen in FIG. 9D, sacrificial layer 252 is then etched, using the mask layer 356 as a guide, to form a hole or opening 360 in the sacrificial layer 252. At this point, the mask layer 356 is removed. A mechanical layer 382 is then deposited over the sacrificial layer, and along the edges of hole 360, forming both the deformable layer and the support post structure. In some embodiments, this mechanical layer 382 may be made of a reflective material, such that the layer 382 itself will serve as the movable reflective layer. In alternative embodiments, a reflective layer (not shown) may be deposited on the sacrificial layer 252 prior to the deposition of mechanical layer 382, such that mechanical layer 382 is deposited on top of the reflective layer. The mechanical layer 382 may then be patterned and etched to form various features (not shown). A release etch is then performed to remove the layer 252 of sacrificial material, forming an interferometric cavity 319, as seen in FIG. 9E. An interferometric modulator 312 is thus formed in which the underside of the deformable layer 382 serves as the movable reflective surface.

Figure 10A:
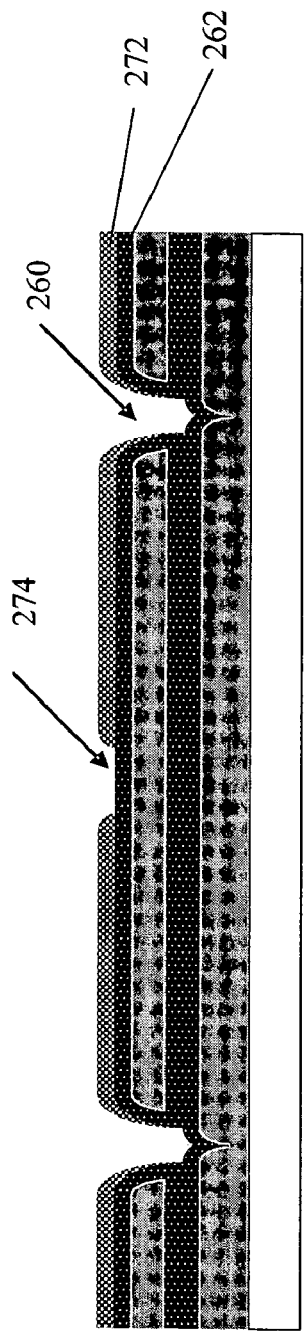
FIGS. 10A-10G are cross sectional views illustrating certain steps of another embodiment of a method of making one embodiment of an interferometric modulator element, such as depicted in FIG. 7.
Figure 10B:
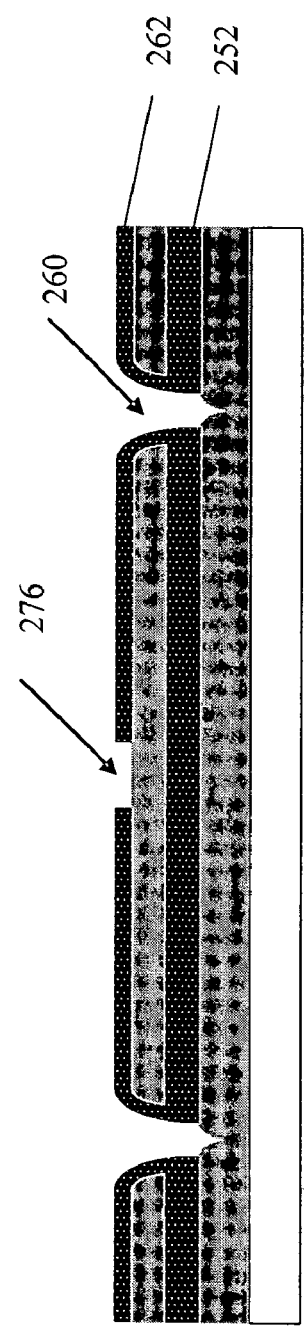

FIGS. 10A-10G are cross-sectional views illustrating certain steps of another embodiment of a method of making one embodiment of the interferometric modulator element 112, such as depicted in FIG. 7. In this embodiment, the method includes the steps depicted in FIGS. 8A-8E. As depicted in FIG. 10A, following the steps illustrated in FIG. 8E, a resist layer 272 is deposited on the sacrificial layer 262 and patterned and etched to define apertures 274 and the post openings 260. The apertures 274 define the location of the conductive member 124, and the post openings 260 define the location of the posts 118. Next, as depicted in FIG. 10B, the sacrificial layers 252 and 262 are etched using the resist layer 272 as a mask to define an opening 276 for the conductive member 124 and openings 260 for the support post 118.

Figure 10C:
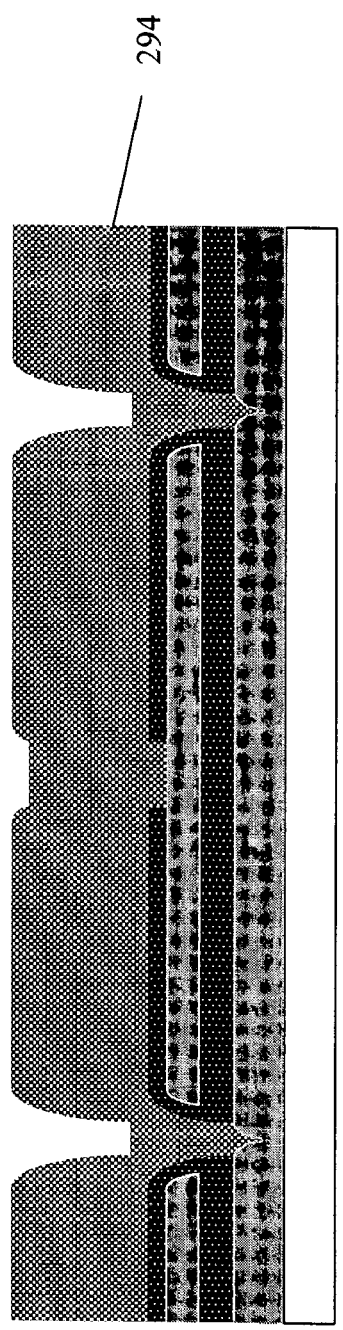
Figure 10D:
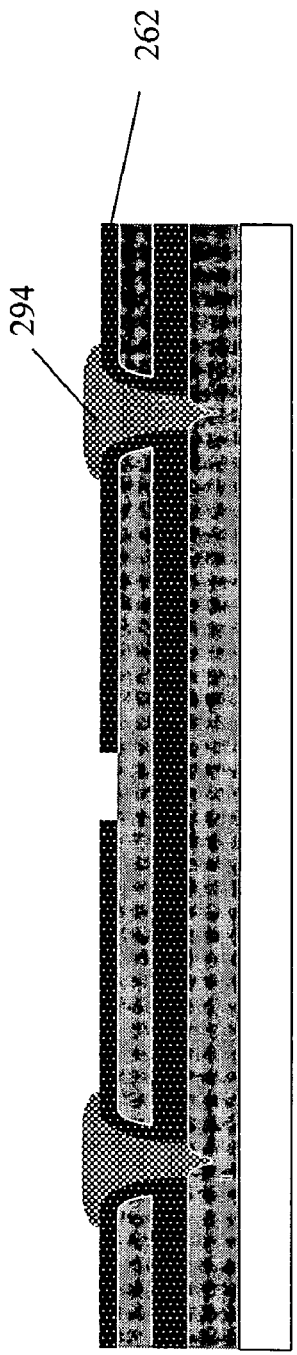
Figure 10E:
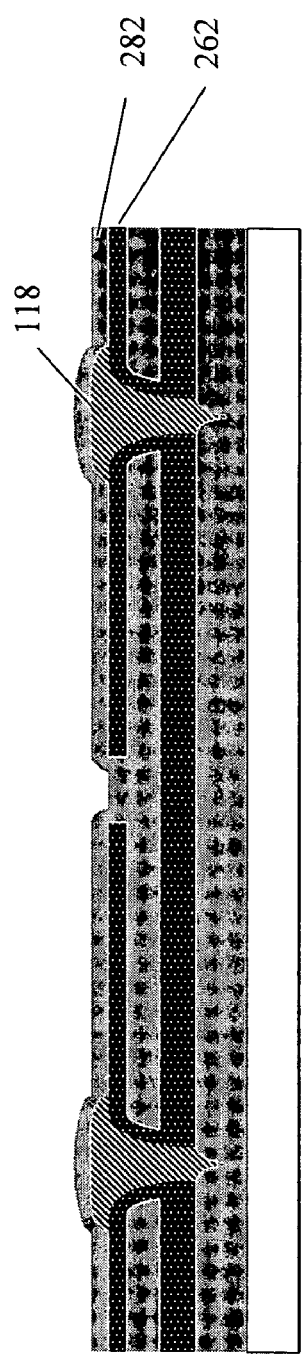

Proceeding to FIG. 10C, a planararization layer 294 is deposited on exposed portions of the layers. The planarization layer 294 can be formed of organic or polymer materials, or any other suitable photo-patternable material such as are known in the art. In one embodiment, the planarization layer 294 is formed of a photoresist material. In other embodiments, the planarization layer 294 can be formed of spin-on materials, such as spin-on-glass. As illustrated in FIG. 10D, the planarization layer 294 is patterned and etched in the form of the post 118. Next, as depicted in FIG. 10E, the planarization layer 294 of FIG. 10D is hardened to increase its rigidity, as more fully explained below. The hardened planarization material thus has increased strength and other improved physical properties as compared to the resist material from which it was originally formed. These improved properties enable the post 118 formed from the hardened material to provide improved support for a flexible layer, such as flexible layer 134 of FIG. 7. In one embodiment, in which the planarization material is a photoresist material, the planarization material can be hardened using exposure to high temperatures to heavily cross link, and harden, the photoresist material. The mechanical layer 282 is desirably deposited over the posts 118 and the sacrificial layer 262.

Figure 10F:
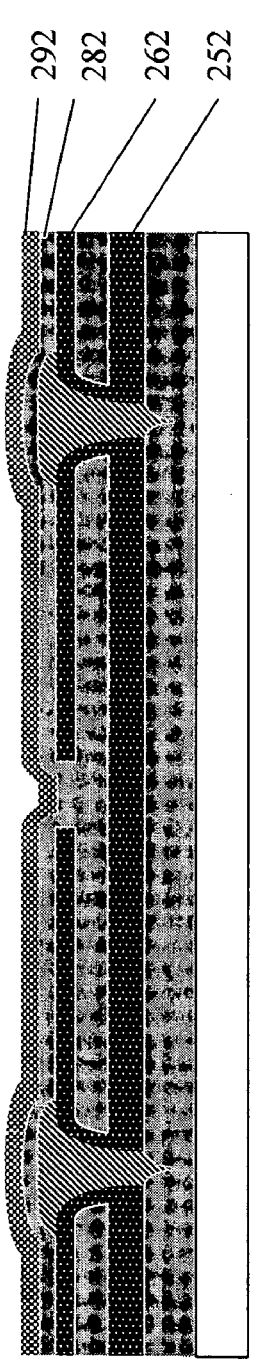
Figure 10G:
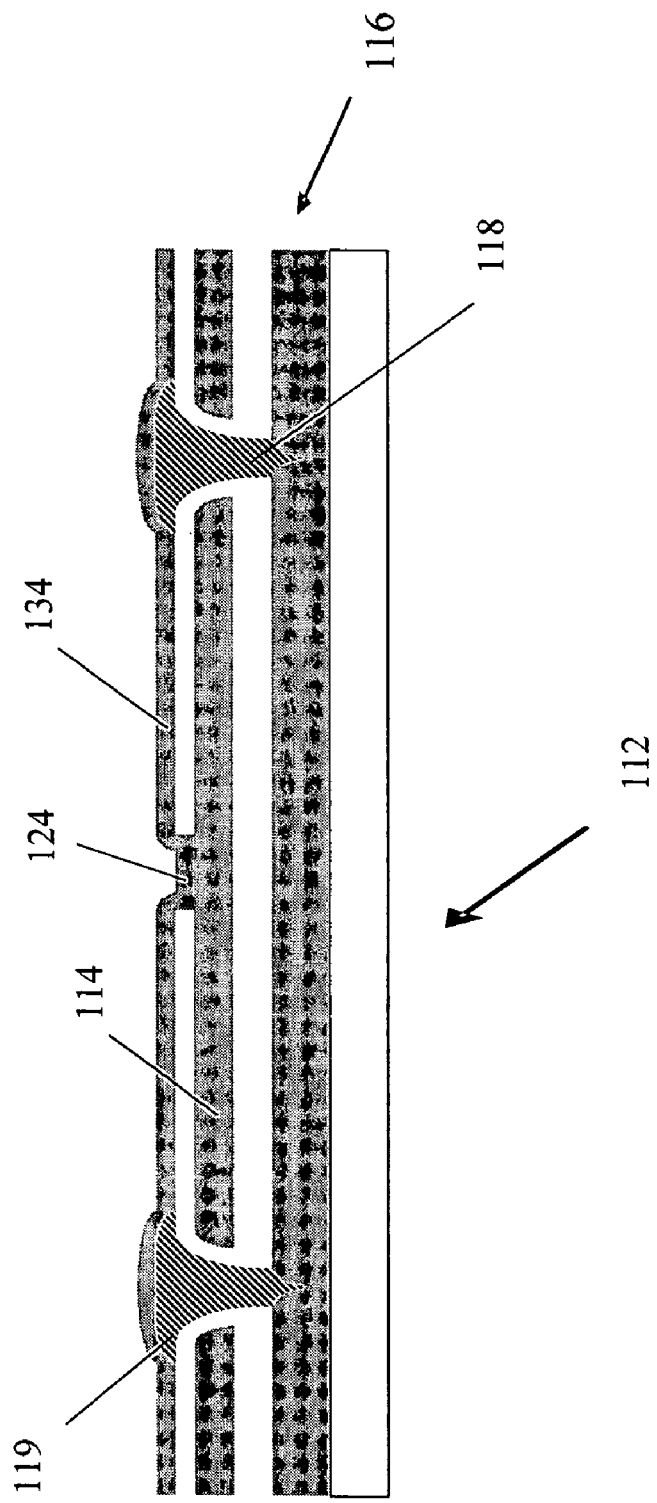

Moving to FIG. 10F, a resist layer 292 is deposited and masked to define other structures (not shown) of the mechanical layer 282. Next, as depicted in FIG. 10G, the sacrificial layers 252 and 262 are removed to define the optical cavity of the interferometric modulator element 112 and to separate the movable mirror 114 from the mechanical layer 134 located above the mirror and the optical stack 116 located below the mirror. In this embodiment, the planarization material forms the post 118. While the planarization material will generally have sufficient hardness to function as a support post over the lifetime of an interferometric display, some slight shift in the color reflected by a particular modulator may occur over time, because the planarization material may never become fully hardened. Thus, for applications in which significant accuracy in the reflected wavelength is required, support posts made from planarization materials may not be desirable. In addition, the hardening process typically undesirably exposes the other layers, e.g., the ITO layer, to high temperatures.

In certain embodiments of interferometric modulator elements 112 which comprise support posts 118, such as the modulator element 112 of FIG. 7, the modulator elements structure is designed to support the flexible layer 134 in as close to a single plane as is possible. In all embodiments, the position of the flexible layer 134 depends upon residual tensile stresses within the flexible layer, which pull the flexible layer toward a substantially flat position. The existence and magnitude of these residual tensile forces may be controlled, and depend on factors such as the materials and the parameters of the deposition process, such as the temperature at which the material is deposited and the rate of deposition. The effect of these residual tensile forces is illustrated in in FIG. 10G, wherein the unattached portion of the flexible layer 10G is substantially flat. However, it can also be seen in FIG. 10G that the resulting flexible layer 134 provided by the process of FIGS. 10A-10G does not lie in a single plane. Rather, the shape of the mechanical layer 282 is affected by the curved upper surface of the posts 118. In addition, it can be seen that the thickness of the support post 118 underlying the mechanical layer 134 becomes very narrow along the lip 119 of the support post 118.

Although the residual tensile forces pull the flexible layer 134 to return to an orientation that is approaching fully flat, the flexible layer 134 is prevented from returning to a completely flat position due to the attachment of portions of the flexible layer 134 to the curved upper surface of the support post. Thus, the post 118 must exert a restraining force on the flexible layer 134. Due to the thinness of the support post 118 in the region underlying the flexible layer 134 at the tip 119 of the support post, there is the potential for mechanical failure at the tip 119. This failure can take the form of partial delamination between the layer 134 and the upper surface of the support post 118, which may permit the layer 134 to move further away from the fixed mirror within the optical stack 116, thereby affecting the interferometric properties of the cavity. Similarly, an increased range of movement could be the result of one or more fractures within the tip 119 of the support post 118, which would allow the flexible layer 134 to move further upward. If such a mechanical failure occurs, this slight mechanical failure may not occur until a point in time well into the useful lifetime of the interferometric modulator element, and may not result in an easily perceivable shift in the reflected wavelength of the modulator element. Thus, for many applications, a flexible layer 134 which is slightly curved is suitable. However, this same curvature increases the fragility of the post lips, so over long periods of time, a partially curved mechanical layer may be undesirable.

Figure 11A:
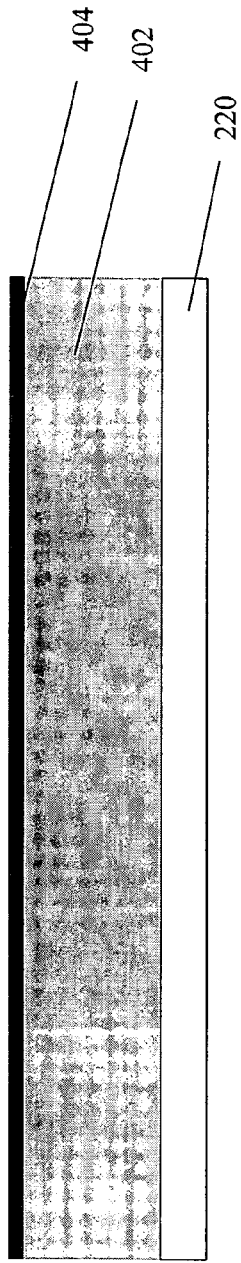
FIGS. 11A-11K are cross sectional views illustrating certain steps of one embodiment of a method of making one embodiment of an interferometric modulator element, such as depicted in FIG. 7, including steps for forming a post prestructure on a substrate.

A process for forming the posts 118 desirably does not require high temperatures or other extreme conditions, while still providing the post 118 with sufficient rigidity to satisfy those embodiments of the modulator element 112 that require such additional rigidity. In addition, this process may advantageously utilize support posts having a substantially flat upper surface, and may also utilize a planarization layer to provide a substantially flat surface for deposition of a mechanical layer. FIGS. 11A-11K illustrate certain steps of one embodiment of a method of making one embodiment of an interferometric modulator element 112, such as depicted in FIG. 7, including steps for forming a post prestructure on the substrate 120. In one embodiment, the substrate 120 of FIG. 7 includes the glass substrate 220 of FIG. 11A. FIG. 11A depicts an early step in a method of forming an interferometric modulator element 112 wherein a spin on glass (SOG) layer 402 is deposited on a glass substrate 220 and a resist layer 404 is deposited on the SOG layer 402. In other embodiments, the layer 402 may be formed using other deposition techniques such as by performing physical vapor deposition (PVD), chemical vapor deposition (CVD), plasma chemical vapor deposition (PVCD), or any other suitable process known in the art.

In certain embodiments, a masking layer (not shown), may be deposited on substrate 220, patterned, and etched prior to the deposition of the layer 402, which will form posts 118. Preferably, this masking layer is patterned and etched such that once the interferometric modulator 112 is formed, the masking layer exists only under the support posts 118. The masking layer prevents light from entering the interferometric modulating element in a non-functional area. Subsequent undesired reflections of such stray light can negatively impact the image quality of an interferometric modulator-based display.

Figure 11B:
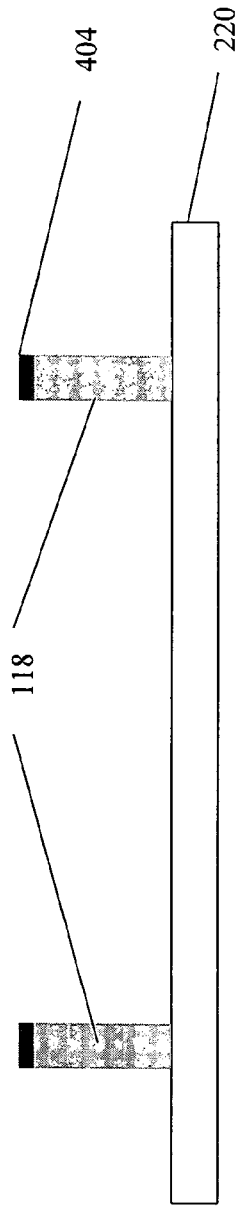
Figure 11C:
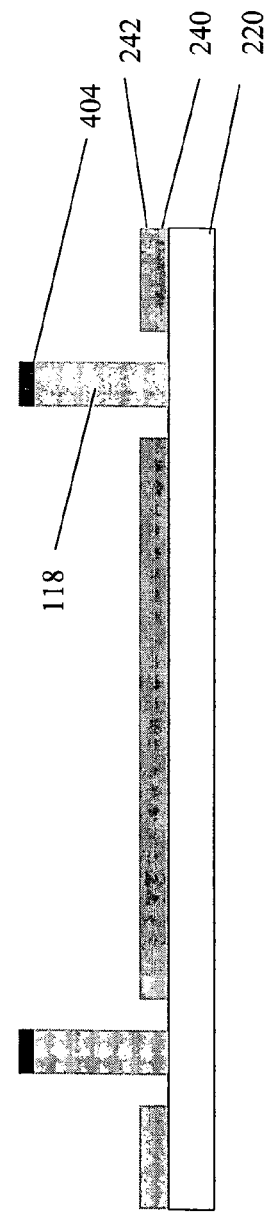

In other embodiments (not shown), preformed support posts such as posts 118 of FIG. 11B may be formed of different materials, or in different positions, than the spin-on glass posts of FIG. 11B. For example, preformed posts comprising silicon oxide, another oxide material, or metal may be formed by depositing a layer of oxide via physical vapor deposition (PVD) on the transparent substrate, and then patterning and etching the layer of oxide to form support posts. In other embodiments, support posts, particularly those formed of a material which does not require annealing at temperatures as high as spin-on glass, can be formed after certain other layers have been deposited. In one embodiment, support posts made of oxide, metal, planarization material, or any other suitable material are formed after the ITO and chrome layers are deposited on the substrate. The placement of support posts above the electrode layer, particularly those support posts made from reflective material, may advantageously reduce or eliminate the need for a masking layer to hide the reflective lower surface of the post from the viewer, as discussed above.

As seen in FIG. 11B, the resist layer 404 is patterned and developed to yield a mask that allows an etch process to form the post structures 118 from SOG layer 402 of FIG. 11A. In one embodiment, the post structures 118 include at least two posts. Remaining portions of the resist layer form post masks 404 on top of the post structures. In one embodiment, the mask layer 404 can be a lift-off resist, such as a lift-off resist material made by MicroChem Corp, of Newton, Mass. The SOG layer 402 thus forms a post prestructure on the substrate 220. Next at FIG. 11C, the ITO layer 240 and chrome layer 242 are deposited on the glass substrate 220, then patterned and etched to form portions of the optical stack 116 of FIG. 7. Thus, in this embodiment, the rigid glass layer 402 of FIG. 10A is applied before the ITO 240 and chrome layer 242, allowing a rigid post 118 to be formed without needing to expose any other layers to high temperature processes that would typically tend to damage materials such as are in the ITO layer 240.

Figure 11D:
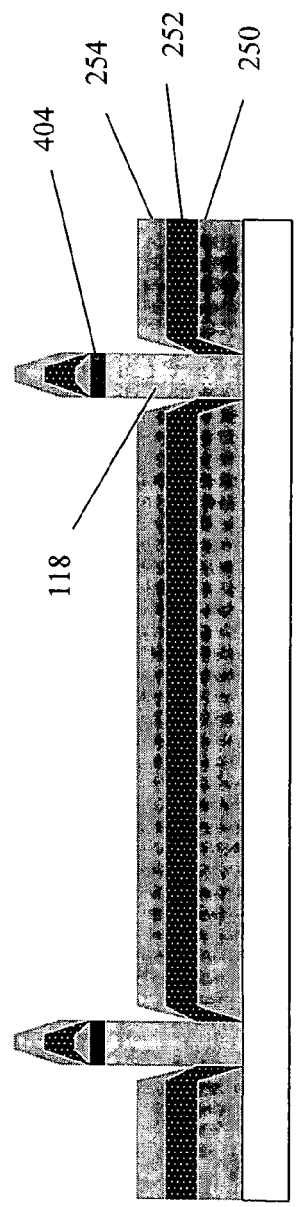

Next, as depicted in FIG. 11D, the oxide layer 250, sacrificial layer 252, and mirror metal layer 254 are deposited onto exposed portions of the layers. Note that these layers can also be deposited onto the post mask 404. With the post 118 in place, subsequent layers such as the oxide layer 250 are typically shadowed by the post 118. This shadowing causes the oxides 250 to taper off to the post. This taper is not so severe as to cause the oxide to fail to cover the underlying ITO 240 and chrome 242 layers and not so extensive as to extend beyond the minimum feature size gap that would normally exist between the post and the mirror. Thus the shadowing effect does not impact the optical performance or percent active area of the modulator.

Figure 11E:
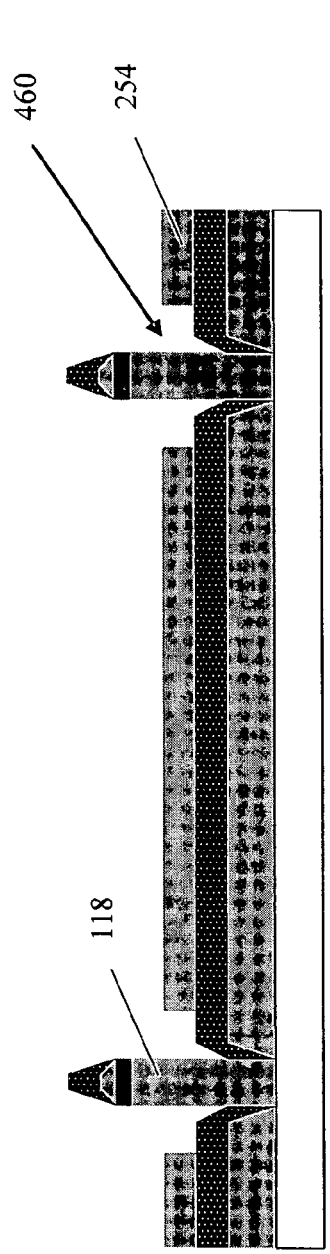
Figure 11F:
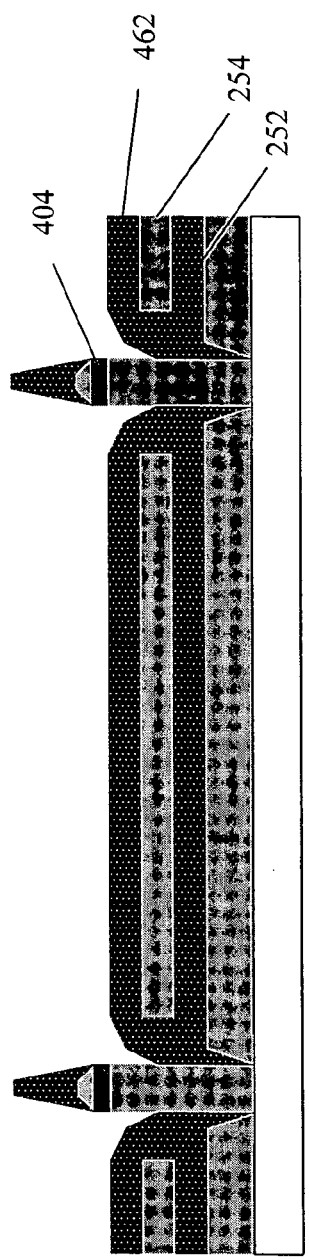

Next at FIG. 11E, the mirror metal layer 254 is patterned and etched away from the posts 118 to define gaps 460 between the post 118 and the mirror layer 254. Moving to FIG. 10F, another sacrificial layer 462 is deposited on exposed portions of the layers. In one embodiment, the sacrificial layers 252 and 462 are molybdenum.

Figure 11G:
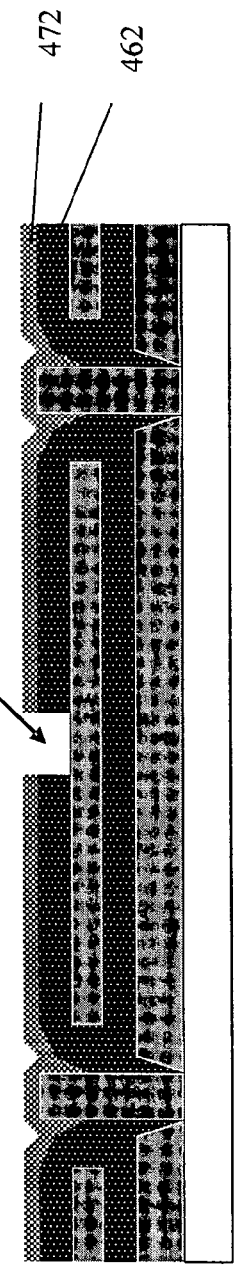

Proceeding to FIG. 11G, the post mask 404, and the residual layers that have been deposited on top of it, are removed using techniques such as those well known in the art. In one embodiment, the lift-off resist removal technique is used. A planarization matieral, which in this case is a resist layer 472, is deposited on exposed portions of the layers, patterned, and etched to define a cavity 474. The sacrificial layer 462 is etched to further define the cavity 474. The cavity 474 defines the form of the conductive connector 124 that extends between the flexible layer 134 and the mirror 114 (see FIG. 7).

Figure 11H:
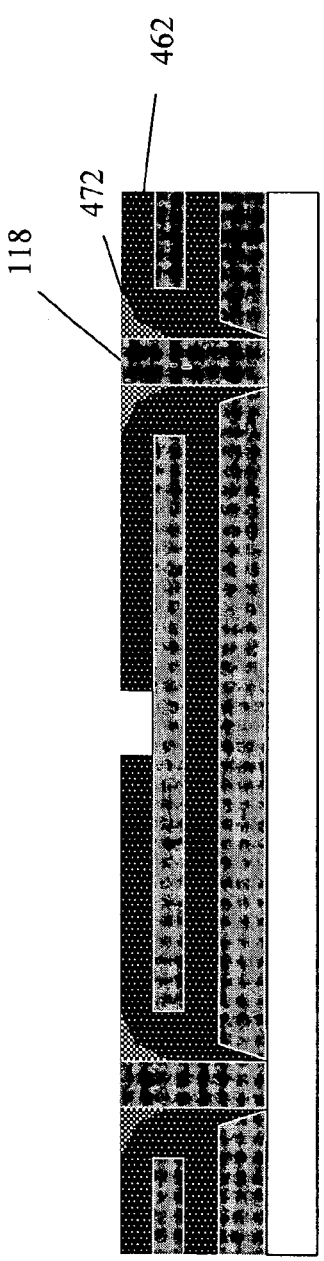
Figure 11I:
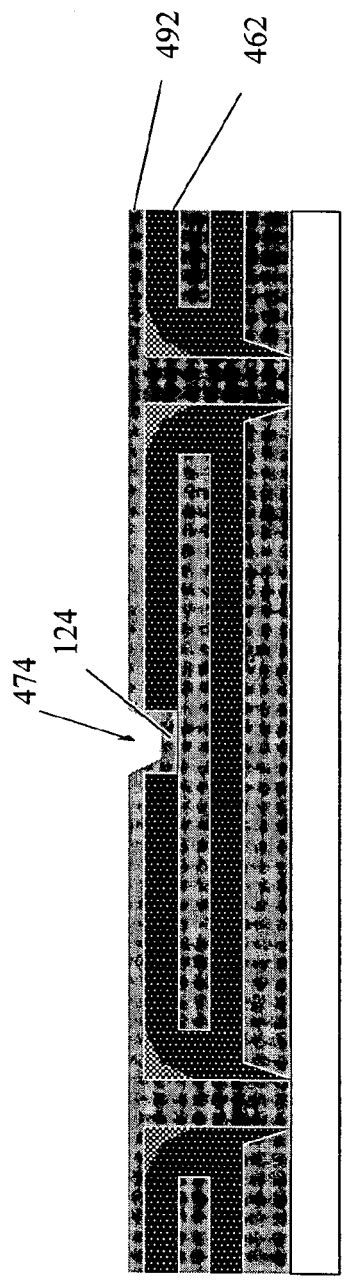

Next at FIG. 11H, etch-back planarization is performed to etch the resist layer 472 back to the sacrificial layer 462 so that the top of the post 118, the remaining resist 472 and the sacrificial layer 462 define a substantially planar surface. Next at FIG. 11I, a mechanical layer 492 is deposited on this substantially planar surface. The mechanical layer 492 also fills the cavity 474 to form the conductive connector 124. At this point, pattern and etch steps are performed on the mechanical layer 492.

Figure 11J:
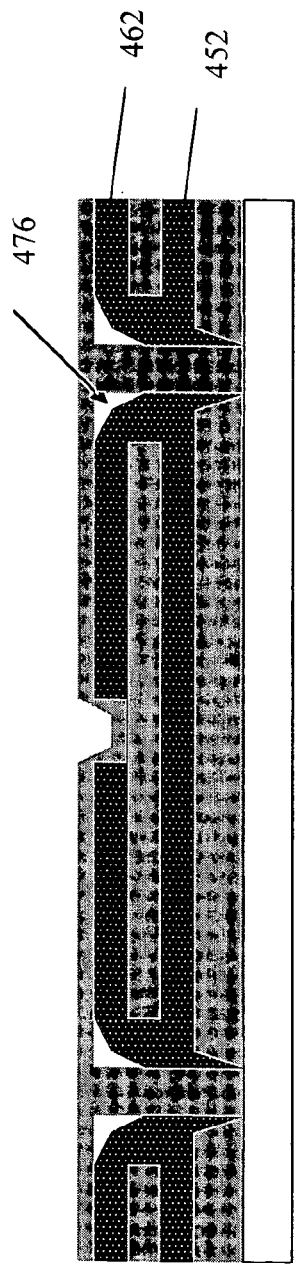
Figure 11K:
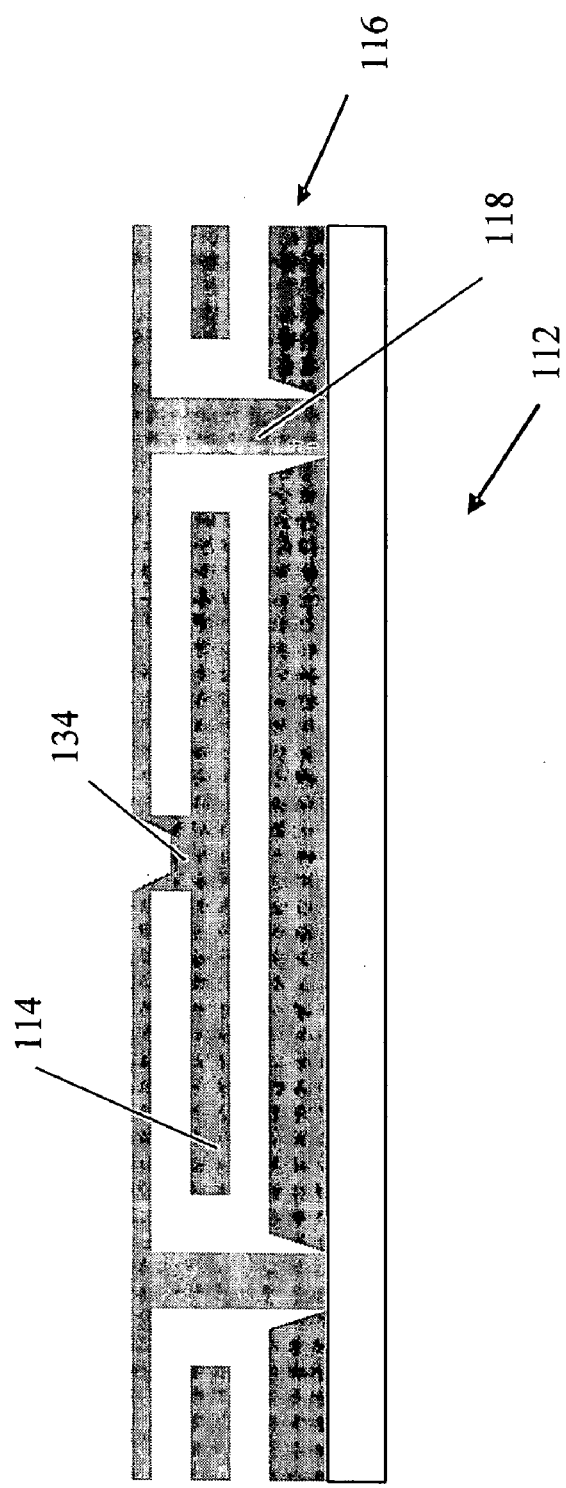

Moving to FIG. 11J, the remaining resist layer 472 is removed, for example, by using an asher, e.g., a barrel etcher or a plasma etcher, to oxidize the resist layer 472 to form a cavity 476. Next as depicted in FIG. 11K, the sacrificial layers are removed. In one embodiment, xenon difluoride is used to remove the sacrificial layers 252 and 462. The movable mirror 114 and the deflectable membrane 134 are thus separated from the fixed members of the element 112. It is to be recognized that embodiments may include other processing steps. For example, other features in the mechanical layer 492 can be formed during the pattern and etch of this layer.

Because the post material may be deposited as a layer 402 which is then etched to form support posts 118, as seen in FIGS. 11A and 11B, greater control over the shape of the upper surface of the posts 118 is available than in the case where the posts are formed after other material has been deposited on the substrate. Thus, flexible layers which are substantially flat along the upper surface of the support posts can be formed, and the post can be made of more robust material than can be deposited later in the process.

The use of an etch-back planarization process to provide a substantially flat surface (as seen in FIG. 11H) prior to forming the mechanical layer also permits, in conjunction with the flat support posts discussed above, the formation on that surface of a substantially flat mechanical layer. It will be understood that the mechanical layer need not be completely flat, particularly due to the deposition of the mechanical layer in the cavity 474. However, the substantially flat flexible layer resulting from the deposition of this mechanical layer is far less likely to undergo mechanical failure of the type discussed above, than is the embodiment of FIG. 10G.

Because the flexible layer 134 is formed in, and tends to dwell in, a state in which the entire layer 134 is substantially flat, the residual tensile forces will not contribute to mechanical failure which permits movement of the flexible layer 134 father upward than is already permitted. Specifically, because the residual tensile forces are pulling in a direction parallel to the upper surface of the support posts 118 when the flexible layer 134 is in the unactuated state, there will be significantly less risk of delamination between the flexible layer 134 and the support post 118 than if the surface was oriented in a direction not parallel to the tensile force. Similarly, because the support posts 118 of FIG. 11K do not have a thin edge portion such as the lip 119 of FIG. 10G, there is significantly less risk of fractures within the post material than if the support post had such a lip. In addition, even if any delamination or fractures occur for other reasons, the residual tensile stresses within the material will not result in movement of the flexible layer further upwards than depicted in FIG. 11K, because these residual stresses pull the flexible layer toward a substantially flat position.

Figure 12A:
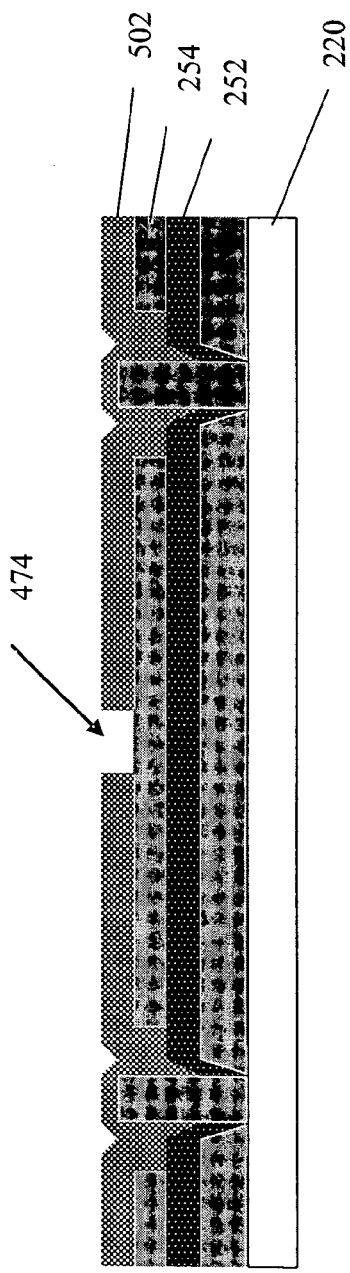
FIGS. 12A-12E are cross sectional views illustrating certain steps of another embodiment of a method of making one embodiment of an interferometric modulator element, such as depicted in FIG. 7, including steps for forming a post prestructure on a substrate.
Figure 12B:
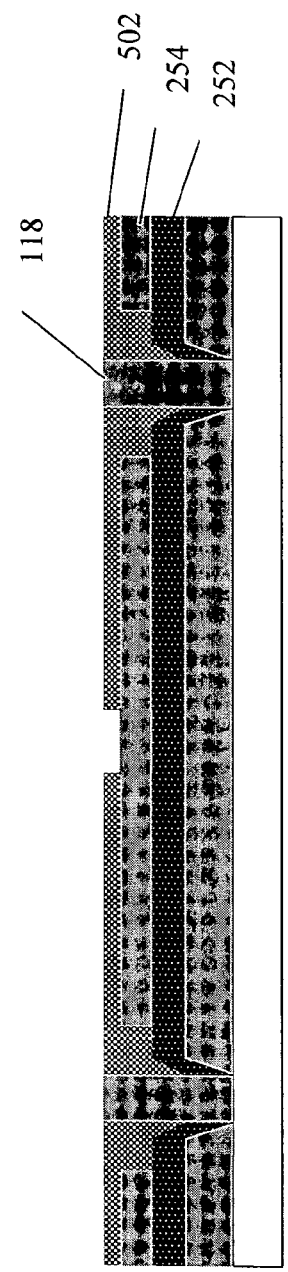
Figure 12C:
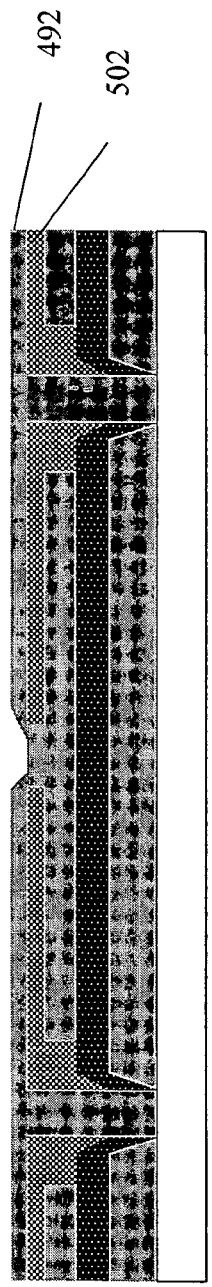

FIGS. 12A-12E are cross-sectional views illustrating certain steps of another embodiment of a method of making one embodiment of the interferometric modulator element 112, such as depicted in FIG. 7, including steps for forming a post prestructure on the substrate 120. This embodiment includes the steps depicted in FIGS. 11A-11E. However, as depicted in FIG. 12A, rather than depositing the second sacrificial layer 462 on the mirror metal layer 254 and exposed portions of other layers, as is done in the steps described with respect to FIG. 11E, the residual layers are stripped from the tops of the posts 118 and planarization material, which in this embodiment is a resist layer 502, is deposited in place of the second sacficifial layer 462 of FIG. 11F. The resist layer 502 is patterned and etched to define the region 474 into which the conductor 124 can be formed. Next, as depicted in FIG. 12B, etch back planarization is performed on the resist layer 502 so that the resist layer and the post 118 define a substantially planar surface. As illustrated in FIG. 12C, the mechanical layer 492 is deposited as in the embodiment depicted in FIG. 11I. The mechanical layer 492 is subsequently patterned and etched.

Figures 12D, 12E:
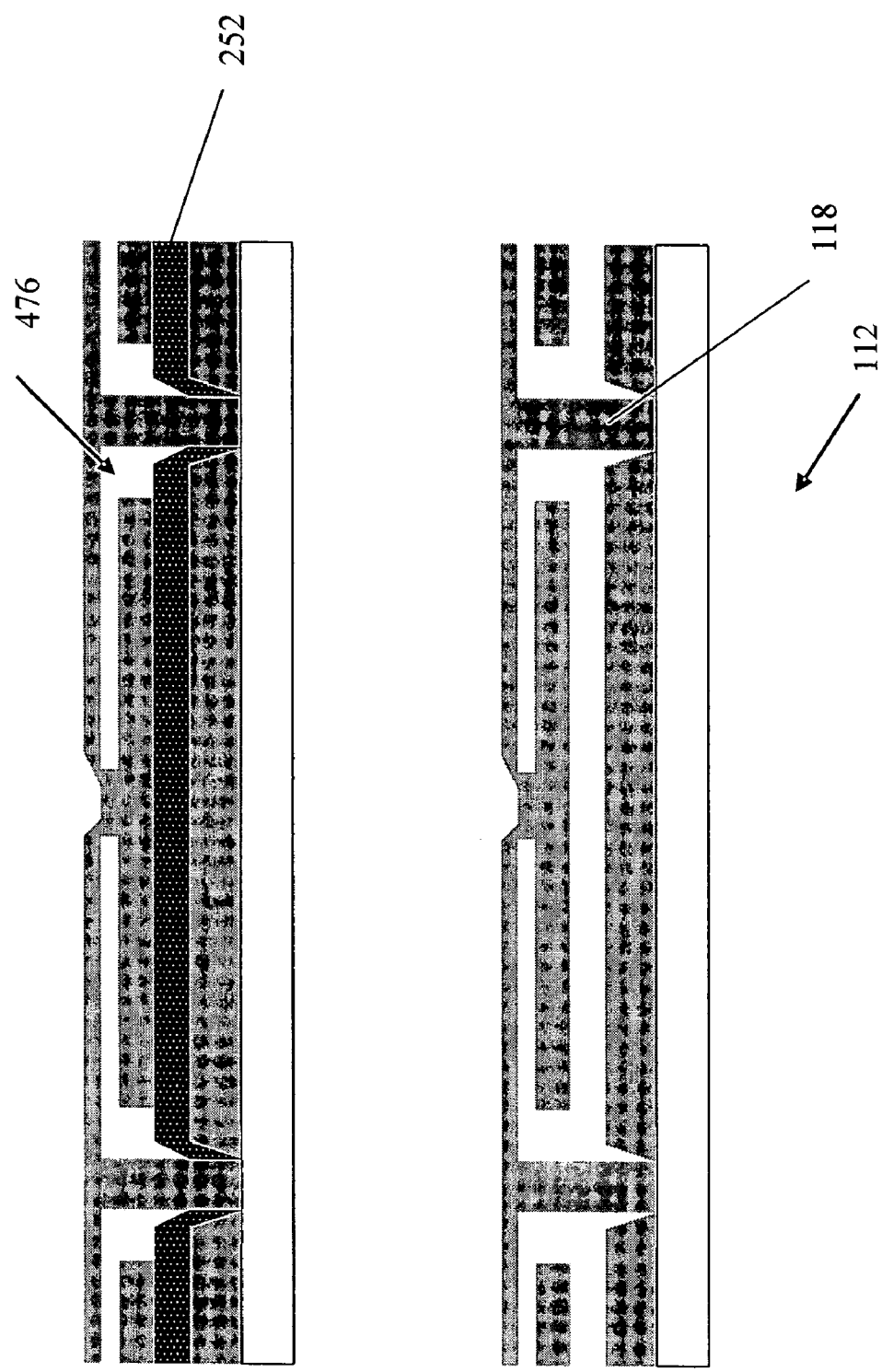

Next as depicted in FIG. 12D, an asher is used to oxidize away the resist layer 502 (shown in FIG. 12C) to define the open region 476. In this embodiment, the region 476 is larger than in the embodiment depicted in FIG. 11I because the region 476 in this embodiment also includes the volume that was occupied by the sacrificial layer 462 in FIG. 11I. Next, as depicted in FIG. 12E, the sacrificial layer 252 of FIG. 11D is removed to define the interferometric modulator element 112.

Thus, the embodiment depicted in FIGS. 12A-12E desirably uses the photoresist layer 502, which is also used to pattern the aperture 474 for the conductor 124, as the second sacrificial layer 462 so as to reduce the total number of process steps as compared to the embodiment depicted in FIGS. 10A-10K. Because planarization material is used to provide the upper sacrificial layer, etch-back planarization can be performed, permitting the formation of a modulator element which, as discussed with respect to FIG. 11K, is less susceptible to changes in its interferometric properties over time.

Figure 13A:
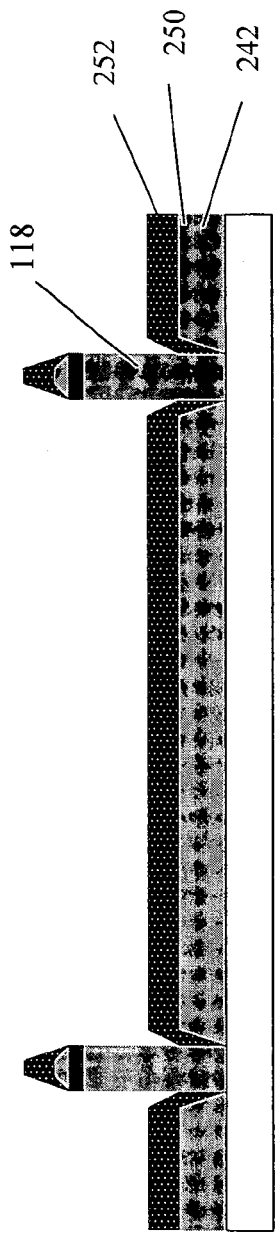
FIGS. 13A-13F are cross-sectional views illustrating certain steps of one embodiment of a method of making another embodiment of an interferometric modulator element in which the deformable layer serves as the movable mirror, such as depicted in FIG. 6A.

In an alternate embodiment, shown in FIGS. 13A-13F, preformed posts 118 can be used to support a combination mechanical/reflective layer, such as layer 382 of FIG. 9G, creating an interferometric modulator similar to the modulator of FIG. 6A. In one embodiment, a method of fabricating such an embodiment includes steps of FIGS. 11A-11C. Following these steps, as illustrated in FIG. 13A, an oxide layer 250 is deposited over the chrome layer 242, and a layer of sacrificial material 252 is deposited over the oxide layer 250.

Figure 13B:
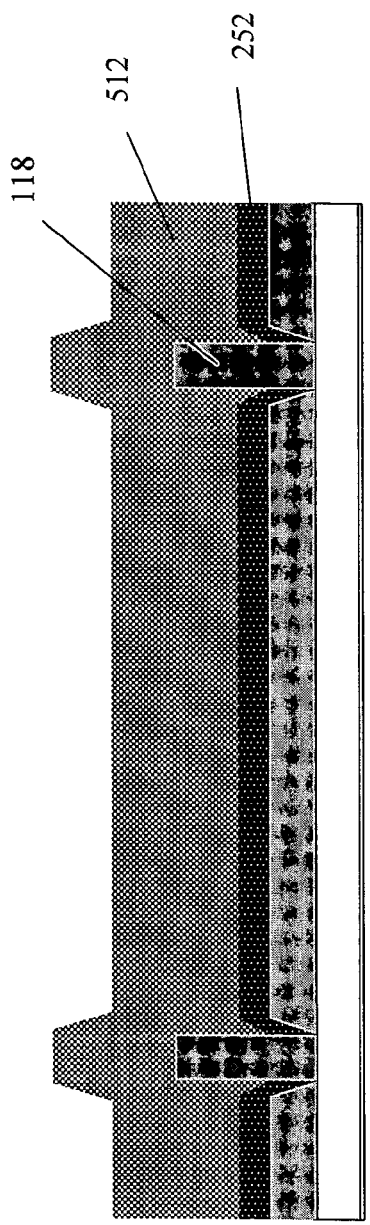
Figure 13C:
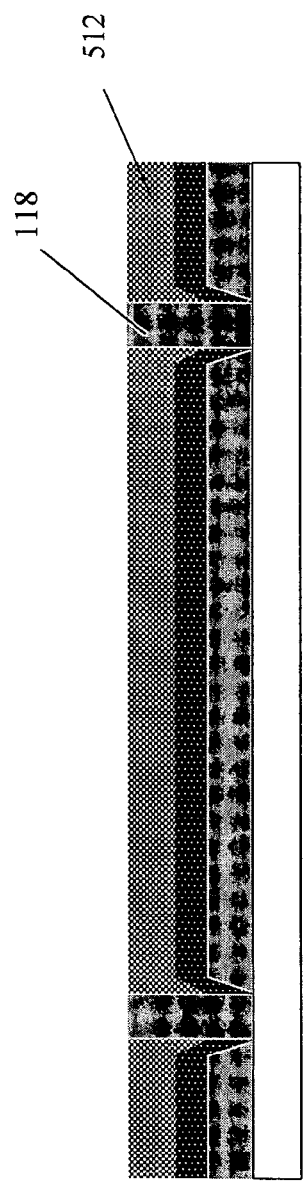

In FIG. 13B, it can be seen that the remnants of previously deposited layers overlying the support posts 118 are stripped from the top of the posts, and a resist layer 512 is deposited over the sacrificial layer 252. Next, in FIG. 13C, etch-back planarization is performed on the resist layer 512 such that the remaining resist layer 512 and support posts 118 define a substantially planar surface.

Figure 13D:
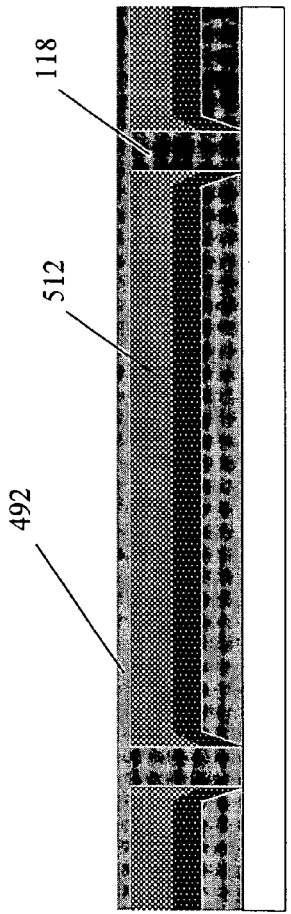

As seen in FIG. 13D, a mechanical layer 492 is then deposited over the substantially planar surface provided by the resist layer 512 and the support posts 118. In some embodiments, this mechanical layer 492 may be made of a reflective material, such that the layer itself will serve as the movable reflective layer. In alternative embodiments, a reflective layer (not shown) may be deposited on the resist layer 512 prior to the deposition of mechanical layer 492, such that mechanical layer 492 is deposited on top of the reflective layer. The mechanical layer 492 is then patterned and etched to form various features (not shown).

Figure 13E:
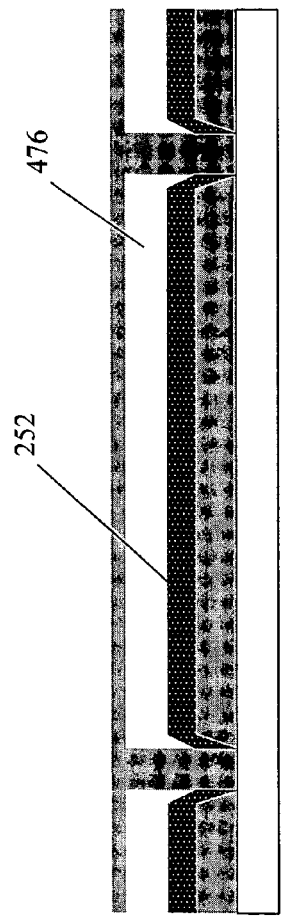
Figure 13F:
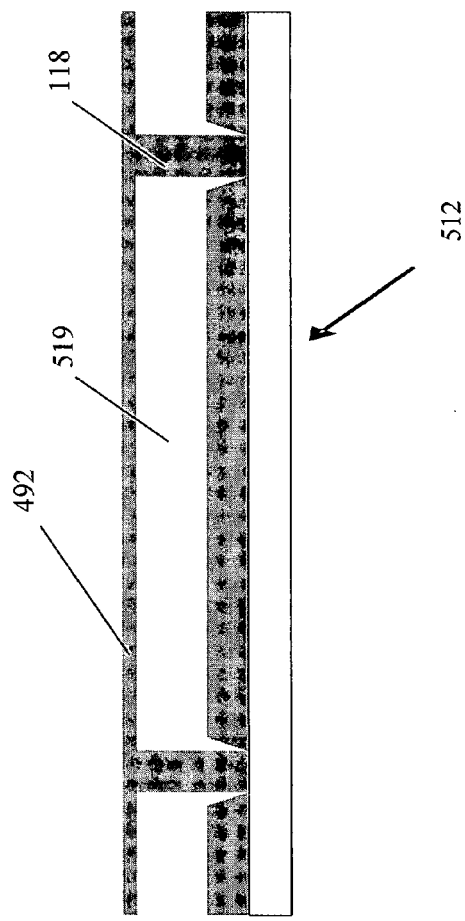

In FIG. 13E, an asher is used to oxidize away the resist layer 512 (shown in FIG. 13D) to define an open region 476. A release etch is then performed to remove the layer 252 of sacrificial material, forming an interferometric cavity 519, as seen in FIG. 13F. An interferometric modulator 512 in which the underside of the deformable layer 492 serves as the movable reflective surface is thus formed. As with the interferometric modulator 112 of FIG. 11K, any residual tensile forces within the deformable layer 492 will not tend to cause mechanical failures of the type discussed above, but will instead bias the deformable layer 492 to return to the position depicted in FIG. 13F.

In further embodiments, additional layers or structures can be formed above posts 118 in order to provide additional rigidity to the posts, and/or to provide a larger amount of surface area for the mechanical layer and other features. In one embodiment, a method for forming cap structures above posts includes the steps of FIG. 11A-11I, wherein preformed support posts comprising a material such as spin-on glass are fabricated, a planarization layer is used to provide a substantially flat surface, and a mechanical layer is deposited over the substantially flat surface and etched to form various features (not depicted), as discussed above.

Figure 14A:
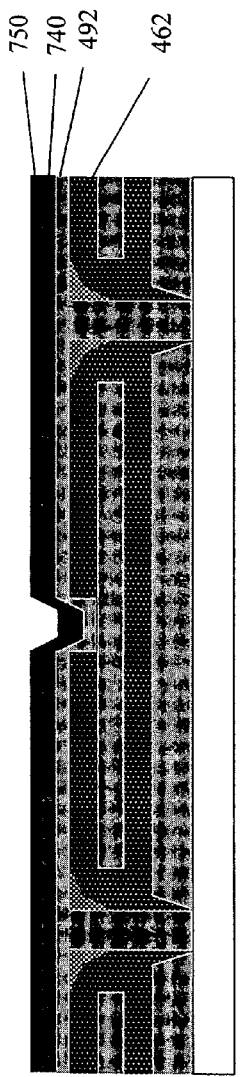
FIGS. 14A-14D are cross sectional views illustrating certain steps of an embodiment of a method of making one embodiment of an interferometric modulator element, in which cap structures are located at the tops of the support posts.

Next, in FIG. 14A, a layer of insulating material 740 is deposited over the mechanical layer 492. In the depicted embodiment, a layer of rigid material 750 is then deposited over the insulating layer 740. However, as will be discussed in greater detail below, in certain embodiments, the layer of rigid material may not be necessary, if the layer of insulating material 740 is sufficiently thick and/or rigid. The layer of insulating material 740 may comprise, in one embodiment, an oxide such as silicon oxide, but any suitable material which can serve as an electrical insulator may be used. The layer of rigid material 750 may be any suitable material, and the use of an insulating layer 740 in contact with the patterned mechanical layer 492 enables the use of electrically conductive material in the rigid layer 750, as the rigid layer is electrically isolated from the mechanical layer. In one embodiment, the rigid layer 750 comprises the same material used in the mechanical layer 492. In one embodiment, both the mechanical layer 492 and the rigid layer 750 comprise nickel. In alternate embodiments, one or both of the layers 492 and 750 may comprise aluminum. However, it may be desirable to utilize a different material, as the mechanical layer 492 will be formed of a material which permits flexure, and additional rigidity may be desired for the rigid layer 750. A wide range of materials may be suitable for use in the rigid layer 750, as depositing a sufficiently thick layer of these materials may provide the necessary rigidity.

Figure 14B:
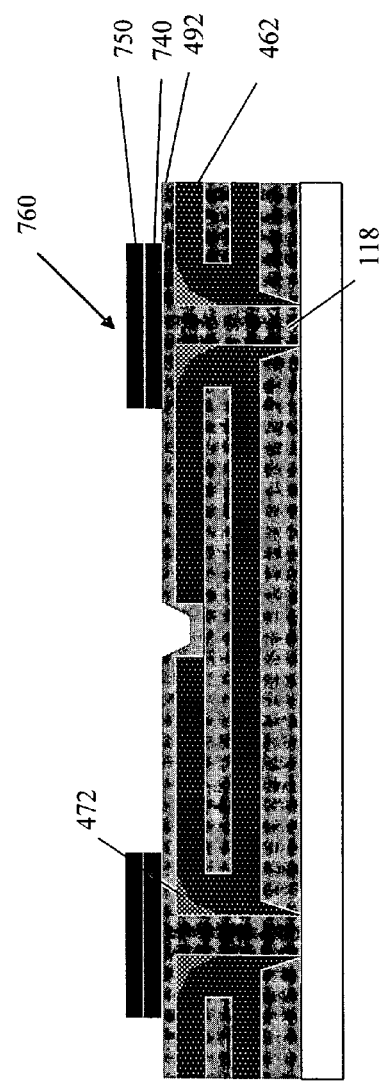

In FIG. 14B, it can be seen that the rigid layer 750 has been etched, using the insulator layer 740 as an etch stop. The insulator layer 740 has itself then been etched, using the mechanical layer 492 and the underlying sacrificial layer 462 and the remnants of the resist layer 472 as etch stops. By these etches, cap structures 760 having a rigid layer 750 overlying an insulating layer 740 are formed above posts 118.

Figure 14C:
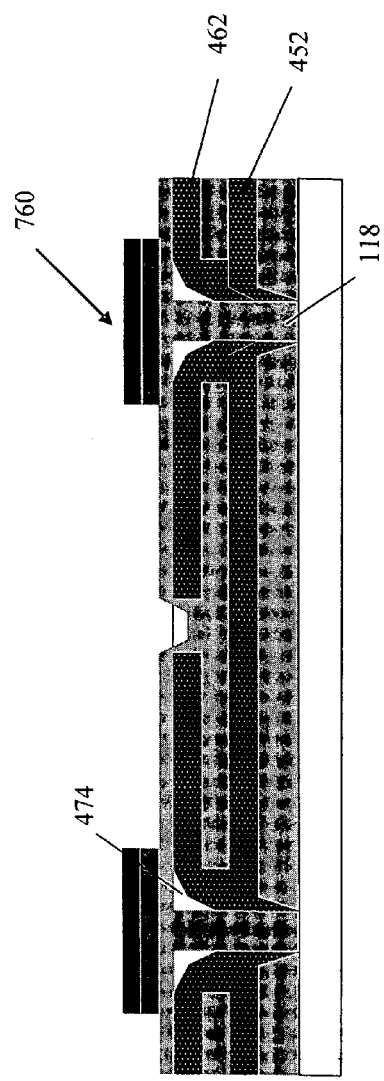
Figure 14D:
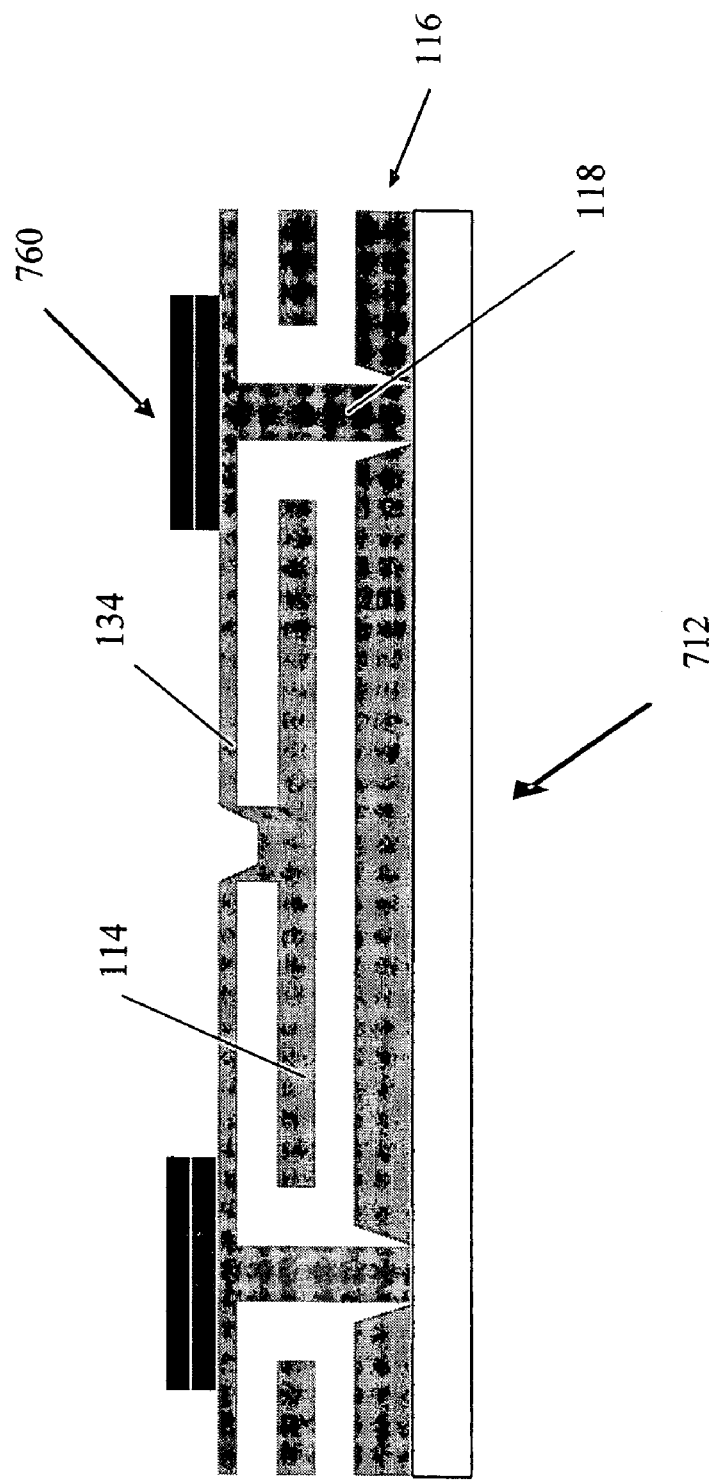

Next, as seen in FIG. 14C, the resist layer 472 is removed, such as by using an asher, as discussed previously, leaving cavities 474. In FIG. 14D, a release etch is performed to remove the sacrificial layers 462 and 452, separating the mirror layer 114 from the flexible layer 134 above the mirror and the optical stack 116 below the mirror, thereby forming a modulator element 712. If the mechanical layer 492 (see FIG. 14C) was previously etched so as to totally remove the mechanical layer from above the posts 118, a mechanical layer 492 (see FIG. 14C) forms a flexible layer 134 wherein the flexible layer is suspended from the insulated underside of the caps 760. This enables the creation of very thin supporting posts, as the thickness required for the purposes of physical support may be significantly less than the amount of surface area required at the top of the post to provide the necessary electrical isolation between the various features of the flexible layer 134. Because the caps 760 extend at least partially over the mirrors 114, the surface area required for electrical isolation does not negatively impact the amount of functional area in the modulator element 712. In alternate embodiments, as discussed above, the caps 760 may be formed solely of insulating material 740, if the insulating material has sufficient thickness or rigidity to support the flexible layer 134.

In further embodiments, the preformed support posts may comprise a column of conductive material such that the top of the post 118 may be placed in electrical communication with an element located below the post. In such a situation, upon deposition of the insulating layer 740, the insulating layer 740 may be etched over the support post so as to expose the conductive material within the post 118 without exposing the patterned mechanical layer 492. When the layer of rigid material 750 is deposited over the insulating layer 740, the cavity in the insulating layer is filled, and provided the rigid material 750 is electrically conductive, an electrical connection can be made between the top of the resulting cap 760 and an element underlying the post 118.

Figure 15A:
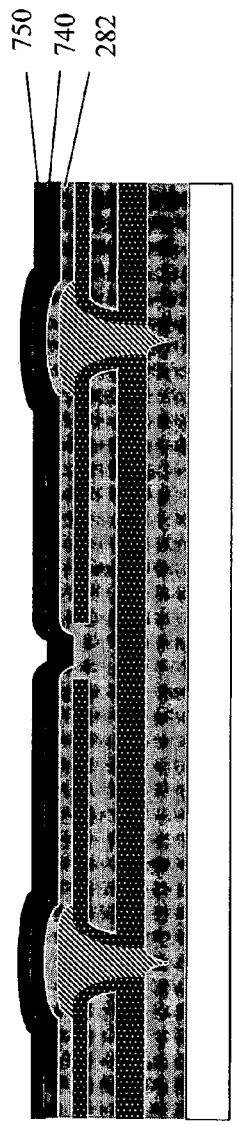
FIGS. 15A-15C are cross sectional views illustrating certain steps of another embodiment of a method of making one embodiment of an interferometric modulator element, in which cap structures are located at the tops of the support posts.

Overlying support material may be formed above the other types of support posts discussed in this application. For instance, a method of providing an overlying cap structure includes the steps depicted in FIGS. 10A-10F. However, in the embodiment of FIG. 15, after the mechanical layer 282 has been etched and the resist layer 292 (see FIG. 10F) has been removed, a layer of insulating material 740 is deposited over the patterned mechanical layer 282, and a layer of rigid support material 750 is then deposited over the insulating layer 740, as can be seen in FIG. 15A.

Figure 15B:
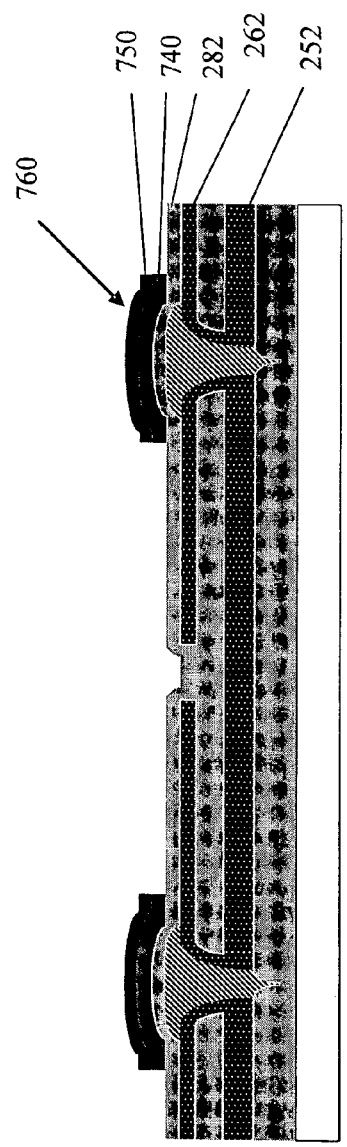

Moving to FIG. 15B, it can be seen that cap structures 760 have been created by etching the rigid support layer 750, using the insulating layer 740 as an etch stop. The insulating layer 740 has then been etched, using the underlying mechanical layer 282 and sacrificial layer 262 as etch stops.

Figure 15C:
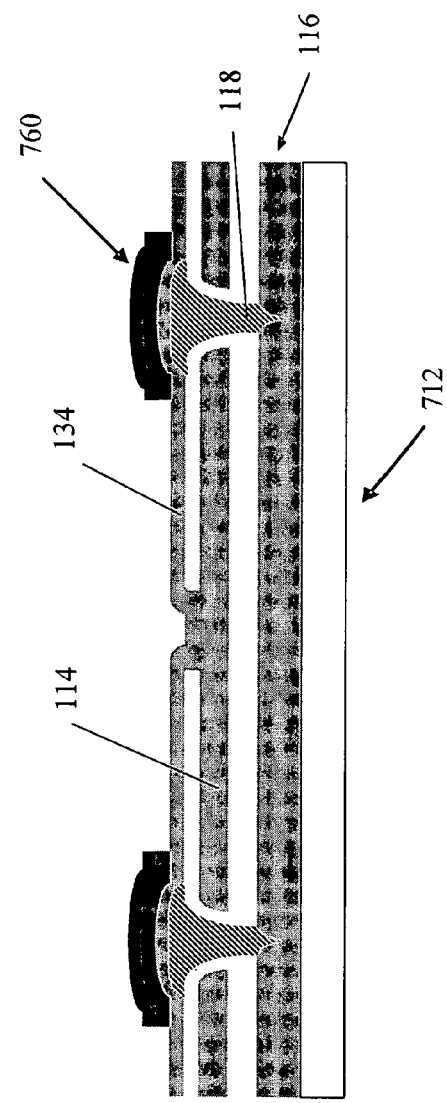

Then, in FIG. 15C, it can be seen that an interferometric modulator element 712 is formed, by etching the sacrificial material 252 and 262 to release the mirror 114, as discussed above. Thus, the interferometric modulator element 712 comprises posts 188 made from planarization material, and an overlying cap 760, which provides additional support for the flexible layer 134. In alternate embodiments, the mechanical layer 282 may be etched so as to completely remove the mechanical layer overlying the curved upper surface of the posts 188. The caps 760 can then extend sufficiently beyond the edges of the post 188 to support the flexible layer 134.

Figure 8I:
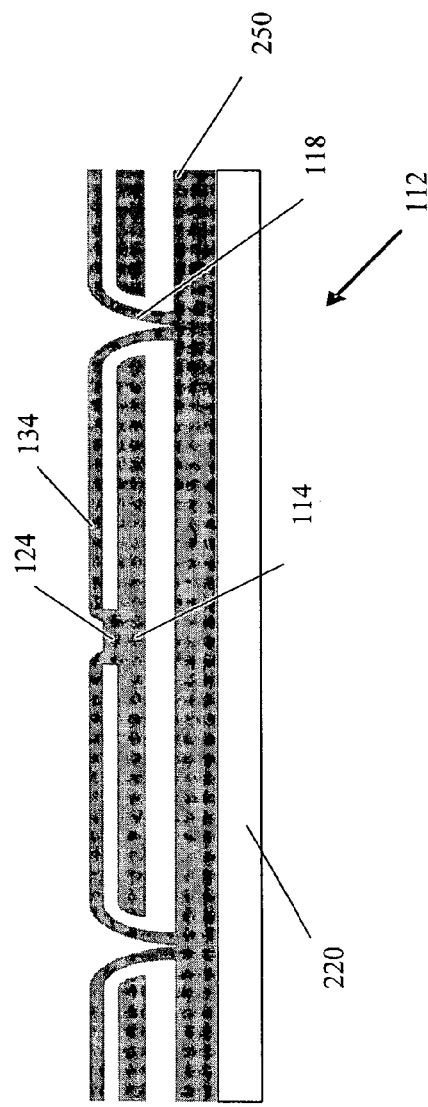
Figure 16A:
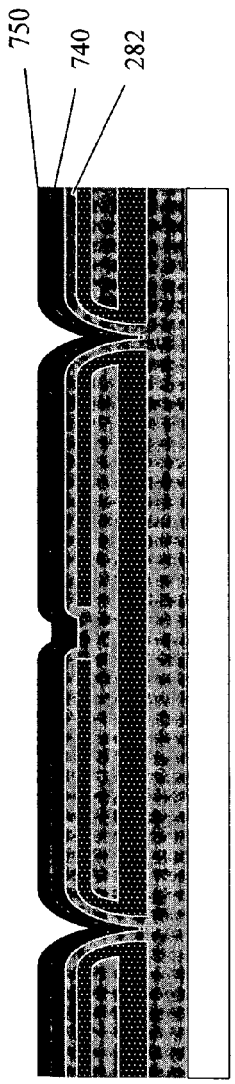
FIGS. 16A-16C are cross sectional views illustrating certain steps of another embodiment of a method of making one embodiment of an interferometric modulator element, in which cap structures are located at the tops of the support posts.
Figure 16B:
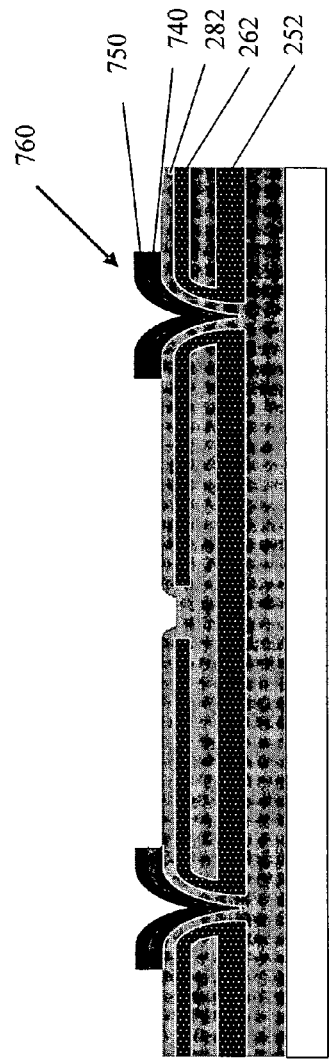
Figure 16C:
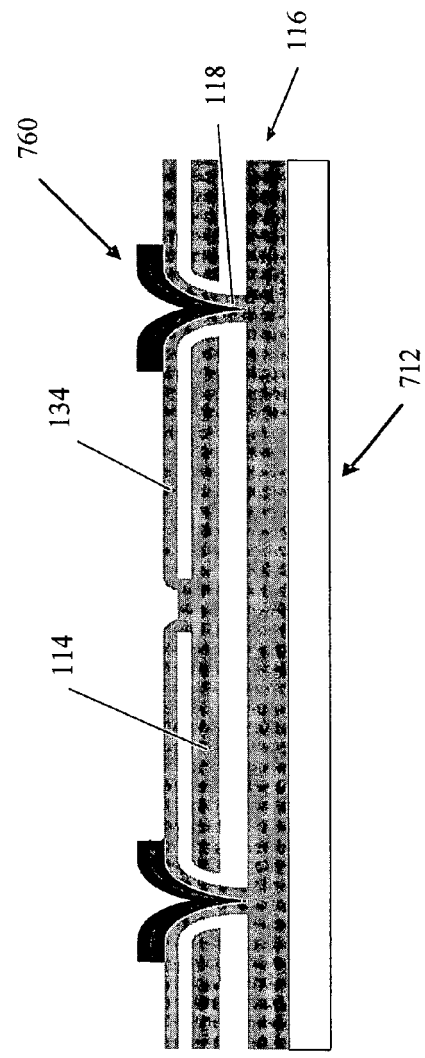

Another method of providing additional support for support posts, such as the support posts 118 of FIG. 8I, includes the steps of FIGS. 8A-8H. Once the mechanical layer 282 has been patterned and the resist layer 292 (see FIG. 8H) has been removed, as described with respect to FIGS. 8H and 8I, an insulating layer 740 and a support layer 750 are deposited above the patterned mechanical layer 282, as seen in FIG. 16A. Next, in FIG. 16B, the rigid support layer 750 is first etched, followed by the insulator layer 740, forming a cap structure 760 of additional support material. In FIG. 16C, an interferometric modulator 712 is formed by performing a release etch, removing the sacrificial layers 262 and 252, releasing the mirror 114, as discussed above.

Figure 17A:
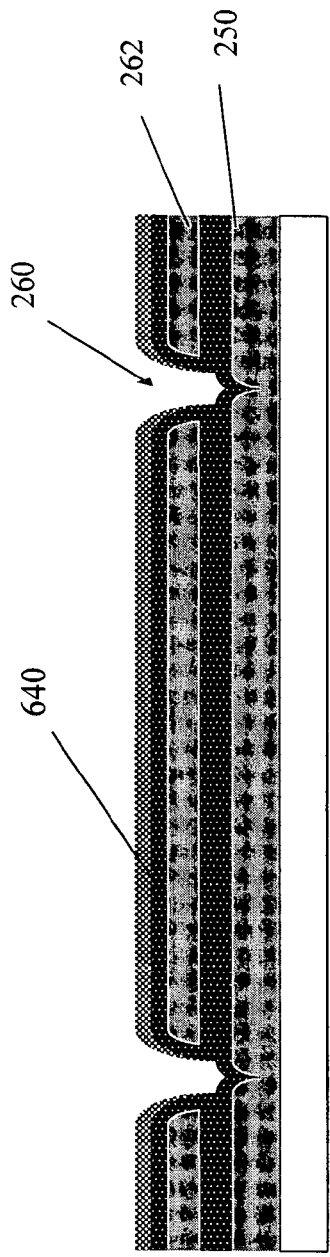
FIGS. 17A-17F are cross sectional views illustrating certain steps of another embodiment of a method of making one embodiment of an interferometric modulator element, in which cap structures are located at the tops of the support posts.
Figure 17B:
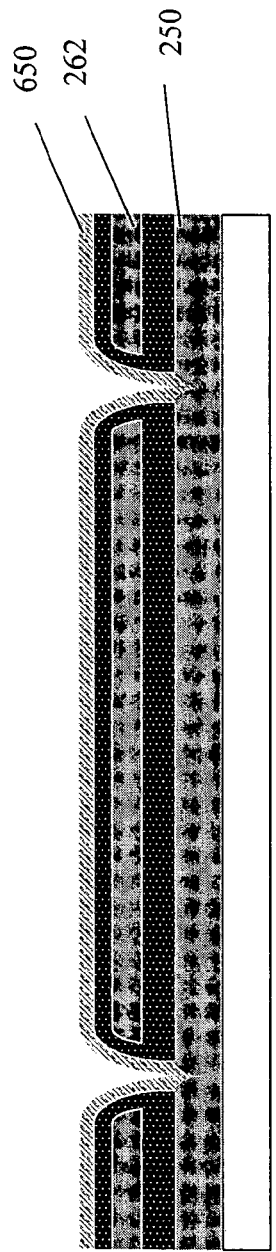
Figure 17C:
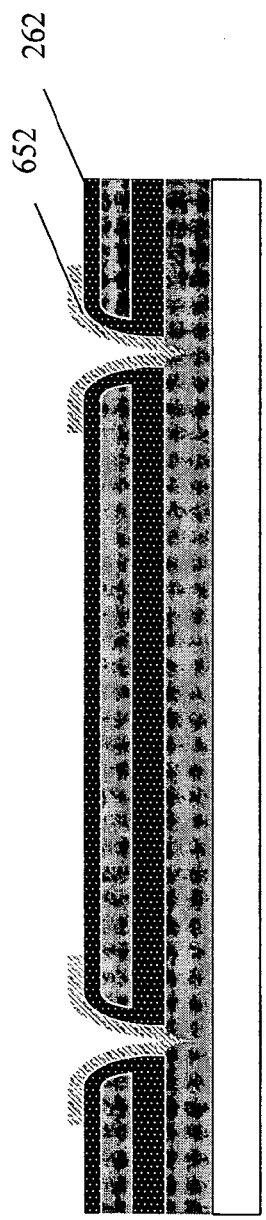
Figure 17D:
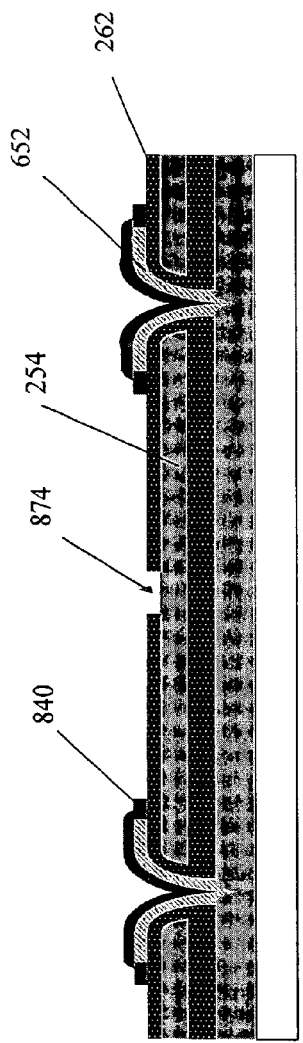
Figure 17E:
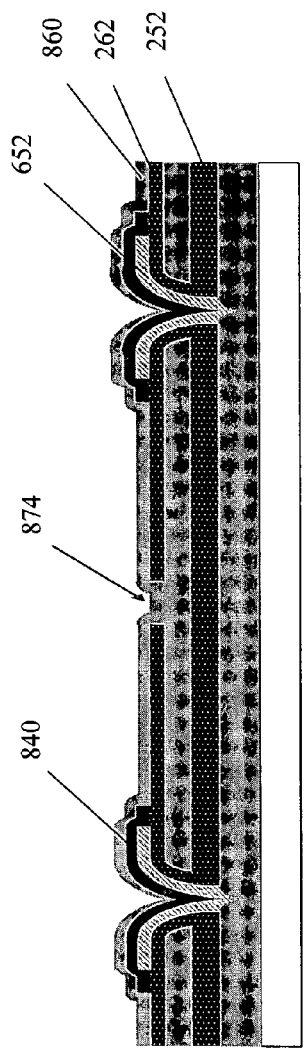
Figure 17F:
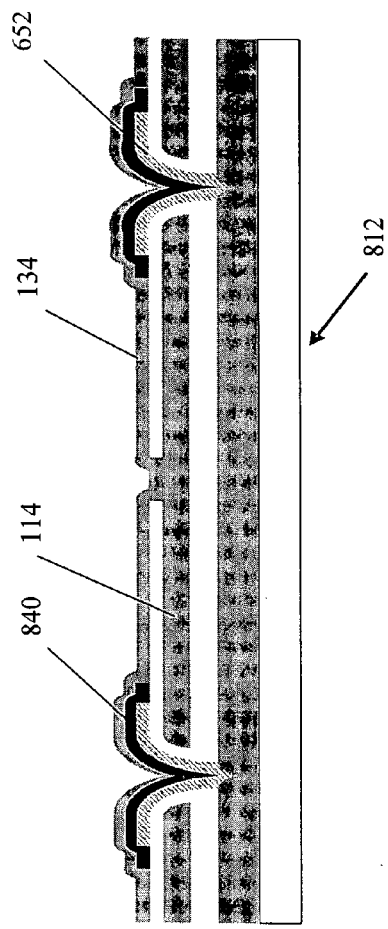

Another method of forming cap structures includes forming an interferometric modulator comprising freestanding support posts 652 (see FIG. 17F). This method includes the process of FIGS. 8A-8E. Following that process, in FIG. 17A, a resist layer 640 is deposited over the sacrificial layer 262. However, unlike the resist mask 272 of FIG. 8F, the resist mask 640 of FIG. 17A need not have an aperture 274 for etching. Rather, the resist mask 640 need only provide apertures within the post holes 260, for etching the portion of sacrificial layer 262 exposed by the resist mask 640.

In FIG. 17B, it can be seen that the resist mask has been used to etch the sacrificial layer 262 to expose the oxide layer 250 underneath the post hole 260 of FIG. 17A. A layer of support post material 650 is then deposited. In this embodiment, it can be seen that the support post material is non-planarizing, and thus the deposited layer conforms to the shape of the underlying layers, leaving part of the post hole 260 unfilled, rather than filling the entirety of the post hole. While in some embodiments the layer of support post material 650 may comprise material suitable for use as a mechanical layer, it will be understood that the selection of support post material need not be so limited. Rather, the support post material 650 may advantageously be a material which has significant rigidity, rather than the flexibility desirable in mechanical layer material. Additionally, the support post material 650 is desirably selectively etchable relative to the sacrificial layer 262.

In FIG. 17C, it can be seen that the support post material 650 has been patterned and etched such that certain support post material beyond the vicinity of the post holes 260 (see FIG. 17A) has been removed, leaving support posts 652. In one embodiment, these support posts are roughly symmetrical about a central axis, and are thus substantially conical in shape in the center, having a wide, substantially flat outer edge area. In another embodiment, the support posts may be wider in one direction than in another, and are thus substantially wedge-shaped.

Next, in FIG. 17D, a layer of insulating material 840 is deposited over the support posts 652 and the exposed underlying sacrificial layer 262. The insulating material 840 is then patterned and etched so as to remove certain insulating material 840 overlying the sacrificial material 262, leaving insulating material only in the area around the support posts 652. An aperture 874 is then etched in the sacrificial layer, exposing the underlying mirror layer 254. In FIG. 17E, it can be seen that a mechanical layer 860 is then deposited, such that it overlies the insulating material 840 and fills the aperture 874. The mechanical layer 860 is then patterned and etched to form features (not shown).

In FIG. 17F, it can be seen that a release etch has been performed to remove the sacrificial material 262 and 252, separating the mirror 114 from the surrounding material, as discussed above. An interferometric modulator element 812 is thus formed, having cap structures formed from insulating material 840, which are located above posts 652 and provide support for the flexible layer 134. In the depicted embodiment, no additional rigid support layer may be necessary, as the wide underlying support post 652 may provide sufficient rigidity.

It is to be recognized, that the order of layers and the materials forming these layers in the above embodiments are merely exemplary. As an example, in the method of FIGS. 13A-13F, no sacrificial layer need be deposited. Rather, the planarization layer can serve as the entire sacrificial material, which will then be removed to form the cavity between the deformable upper layer and the optical stack. Moreover, in some embodiments, other layers, not shown, may be deposited and processed to form portions of the interferometric modulator element 112 or to form other structures on the substrate. In other embodiments, these layers may be formed using alternative deposition materials, may be deposited in different order, or composed of different materials, as would be known to one of skill in the art, or as also discussed in more detail in the patents and applications discussed above.

As another example, the cap structures discussed above may be utilized in embodiments in which the flexible layer serves as the movable reflective layer. For instance, the embodiment depicted in FIG. 13F may be modified to include cap structures at the top of the support posts, from which the flexible reflective layer is suspended. Other embodiments having a combination movable/reflective layer may be similarly modified to provide additional support, improved mechanical characteristics, and increased functional area within the display.

It is also to be recognized that, depending on the embodiment, the acts or events of any methods described herein can be performed in other sequences, may be added, merged, or left out all together (e.g., not all acts or events are necessary for the practice of the methods), unless the text specifically and clearly states otherwise.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of forming an interferometric display element, comprising:
   providing a substrate;
   depositing a layer of support post material over the substrate;
   patterning the layer of support post material to form at least two support posts;
   depositing an electrode layer over the substrate, wherein the depositing of the electrode layer is performed after the forming of the at least two support posts, and wherein at least a first portion of the electrode layer is located between the at least two support posts;
   forming at least a first sacrificial layer over at least the first portion of the electrode layer;
   forming a mechanical layer over the sacrificial layer, wherein the mechanical layer covers a portion of each of the at least two support posts; and
   removing at least a portion of the first sacrificial layer after formation of the mechanical layer, wherein removal of at least a portion of the first sacrificial layer allows a portion of the mechanical layer extending between the at least two support posts to be displaced with respect to the first portion of the electrode layer.

2. The method of claim 1, wherein the support post material comprises spin-on glass.

3. The method of claim 1, wherein the support post material comprises an insulator.

4. The method of claim 3, wherein the insulator comprises silicon oxide.

5. The method of claim 1, wherein the support post material comprises a metal.

6. The method of claim 1, wherein the mechanical layer comprises a reflective surface on a side of the mechanical layer facing the first portion of the electrode layer.

7. The method of claim 1, additionally comprising:
   forming a mirror layer over the electrode layer; and
   patterning the mirror layer to form a mirror.

8. The method of claim 7, additionally comprising:
   depositing a second layer of sacrificial material over the mirror; and
   patterning the second layer of sacrificial material, thereby forming at least one hole in said second layer of sacrificial material, said hole being located over the mirror element.

9. The method of claim 1, wherein forming a mechanical layer over the sacrificial layer comprises:
   forming a planarization layer over the sacrificial layer;
   etching back the planarization layer to provide a substantially planar surface; and
   forming a mechanical layer over the planarization layer.

10. The method of claim 1, additionally comprising:
    patterning the mechanical layer, thereby exposing at least a portion of an underlying layer, wherein pattering the mechanical layer is performed prior to removing at least a portion of the first sacrificial layer.

11. The method of claim 1, wherein the mechanical layer is electrostatically displaceable towards the first portion of the electrode layer upon removal of at least a portion of the first sacrificial layer.

12. The method of claim 1, wherein a second portion of the electrode layer overlies a portion of one of the at least two support posts after deposition of the electrode layer, the method additionally comprising removing the second portion of the electrode layer prior to formation of the mechanical layer.

13. The method of claim 12, additionally comprising depositing a layer of liftoff material over the layer of support post material prior to patterning the layer of support post material, wherein the second portion of the electrode layer is located over the liftoff material, and wherein removing the second portion of the electrode layer comprises removing the layer of liftoff material using a liftoff process.

14. A method of forming a micromechanical system (MEMS) element, comprising:
    forming at least two support posts located over a substrate;
    depositing an electrode layer over the substrate after the formation of the support posts, wherein at least a portion of the electrode layer is located over a support post of the at least two support posts;
    forming at least a first sacrificial layer over the electrode layer;

removing the portion of the electrode layer;

forming a movable layer extending over the at least two support posts and the first sacrificial layer, wherein forming the movable layer is performed after removing the portion of the electrode layer; and removing the first sacrificial layer after forming the movable layer.

15. The method of claim 14, wherein forming at least two support posts comprises:

depositing a layer of support post material over the substrate;

depositing a layer of liftoff material over the layer of support post material; and patterning the layer of liftoff material and layer of support post material.

16. The method of claim 15, wherein removing the portion of the electrode layer comprises removing liftoff material from over the at least two support posts.

17. The method of claim 14, wherein the at least two support posts comprise an insulating material.

18. The method of claim 14, wherein the at least two support posts comprise spin-on glass.

* * * * *